(12) United States Patent
Fujita et al.

(10) Patent No.: US 8,310,121 B2
(45) Date of Patent: Nov. 13, 2012

(54) ELECTRONIC CIRCUIT-INTEGRATED MOTOR DRIVE AND SEMICONDUCTOR MODULE

(75) Inventors: Toshihiro Fujita, Aichi-gun (JP);
Hiroyasu Kidokoro, Kariya (JP);
Atsushi Furumoto, Nukata-gun (JP);
Hideki Kabune, Nagoya (JP); Hideki Minato, Nagoya (JP)

(73) Assignee: Denso Corporation, Kariya (JP)

( * ) Notice: Subject to any disclaimer, the term of this patent is extended or adjusted under 35 U.S.C. 154(b) by 176 days.

(21) Appl. No.: 12/822,614

(22) Filed: Jun. 24, 2010

(65) Prior Publication Data
US 2010/0327679 A1 Dec. 30, 2010

(30) Foreign Application Priority Data

Jun. 24, 2009 (JP) ................................ 2009-149647
Jan. 28, 2010 (JP) .................................. 2010-17452

(51) Int. Cl.
*H02K 11/00* (2006.01)
(52) U.S. Cl. ........................... 310/71; 310/68 A; 310/64
(58) Field of Classification Search .................... 310/71, 310/68 D, 68 R, 68 A; *H02K 11/00*
See application file for complete search history.

(56) References Cited

U.S. PATENT DOCUMENTS

| | | | |
|---|---|---|---|
| 6,429,556 B1 * | 8/2002 | Nakamura et al. | 310/71 |
| 7,541,703 B2 * | 6/2009 | Uehara et al. | 310/68 D |
| 2004/0090130 A1 | 5/2004 | Kaneko et al. | |
| 2008/0136265 A1 | 6/2008 | Mizukoshi et al. | |
| 2010/0060090 A1 * | 3/2010 | Sakata | 310/71 |

FOREIGN PATENT DOCUMENTS

| | | |
|---|---|---|
| JP | 2-37578 | 3/1990 |
| JP | 10-234158 | 9/1998 |
| JP | 10-322973 | 12/1998 |
| JP | 2002-48099 | 2/2002 |
| JP | 2002-345211 | 11/2002 |
| JP | 2004-236470 | 8/2004 |
| JP | 2005073373 A * | 3/2005 |
| JP | 2007-215299 | 8/2007 |
| JP | 2007312523 A * | 11/2007 |
| JP | 2008-131794 | 6/2008 |
| JP | 2008211945 A * | 9/2008 |
| WO | WO 2010/150527 | 12/2010 |
| WO | WO 2010/150528 | 12/2010 |
| WO | WO 2010/150529 | 12/2010 |
| WO | WO 2010/150530 | 12/2010 |

OTHER PUBLICATIONS

JPO Machine Translation, JP 2005-073373, Power Conversion Apparatus, Feb. 5, 2012, http://dossier.ipdl.inpit.go.jp/text_trans.html.*

(Continued)

*Primary Examiner* — Quyen Leung
*Assistant Examiner* — Thomas Truong
(74) *Attorney, Agent, or Firm* — Nixon & Vanderhye PC

(57) ABSTRACT

A motor case is formed in a tubular shape. A semiconductor module includes a semiconductor chip of switching elements, a resin part and a coil terminal. The resin part embeds the semiconductor chip therein. The coil terminal is protruded from the resin part and directly connected to a coil. A connection part between the coil terminal and the coil is arranged at a position, which is between a top wall surface and a bottom wall surface of the resin part facing each other in the axial direction of a motor.

13 Claims, 31 Drawing Sheets

OTHER PUBLICATIONS

JPO Machine Translation, JP 2007-312523, Power Module, Feb. 5, 2012, http://dossier.ipdl.inpit.go.jp/text_trans.html.*
JPO Machine Translation, JP 2008-211945, Vehicle Drive Device, Feb. 5, 2012, http://dossier.ipdl.inpit.go.jp/text_trans.html.*
U.S. Appl. No. 12/822,412, Minato et al, filed Jun. 24, 2010.
U.S. Appl. No. 12/822,396, Yamasaki et al, filed Jun. 24, 2010.
U.S. Appl. No. 12/822,403, Fujita et al, filed Jun. 24, 2010.
U.S. Appl. No. 12/822,635, Miyachi et al, filed Jun. 24, 2010.
U.S. Appl. No. 12/822,381, Iwai et al, filed Jun. 24, 2010.
U.S. Appl. No. 12/822,627, Yamasaki et al, filed Jun. 24, 2010.

* cited by examiner

ELECTRONIC CIRCUIT-INTEGRATED MOTOR DRIVE AND SEMICONDUCTOR MODULE

CROSS REFERENCE TO RELATED APPLICATION

This application is based on and incorporates herein by reference Japanese Patent Applications No. 2009-149647 filed on Jun. 24, 2009 and No. 2010-17452 filed on Jan. 28, 2010.

FIELD OF THE INVENTION

The present invention relates to an electronic circuit-integrated motor device and a semiconductor module.

BACKGROUND OF THE INVENTION

In a conventional motor, a rotating magnetic field is generated by supplying currents to coils of a plurality of phases wound on a stator so that a rotor is rotated by the rotating magnetic field. The coil currents supplied to drive the motor are switched over by a plurality of switching elements as exemplified in the patent document (JP 2002-345211A).

In this patent document, for example, the switching elements are resin-molded as semiconductor modules. The modules are mounted on a printed circuit board and connected to various electronic parts, such as coils and capacitors, through a wiring pattern of copper films formed on the printed circuit board. Since the copper films are normally as thin as less than 100 µm, a large area is needed on the printed circuit board to supply the required currents, in case the semiconductor modules and the coils may be connected by way of the printed circuit board. Thus, it is not possible to reduce a motor device in size.

It is proposed to provide coil terminals for connecting the semiconductor modules and the coils without a printed circuit. If the coil terminals and the coils are connected between the motor and the semiconductor modules, a space must be provided for placing a welding jig, which are used to connect the coil terminals and the coils by welding. It is thus not possible to reduce a motor device in size.

SUMMARY OF THE INVENTION

It is an object of the present invention to provide an electronic circuit-integrated motor device, which can be manufactured in reduced size.

According to the present invention, an electronic circuit-integrated motor device comprises a motor and a semiconductor module. The semiconductor module includes a switching element, a resin part and a coil terminal. The switching element is formed in a semiconductor chip for switching coil currents supplied to coils of the motor. The resin part embeds the semiconductor chip therein and having a top wall surface and a bottom wall surface, which faces the top wall surface and an end wall of the motor in an axial direction of the motor. The coil terminal protrudes from the resin part and has a connection part directly connected to the coil. The connection part is arranged at a position, which is more distant from the end wall of the motor case than the bottom wall surface of the resin part in the axial direction of the motor case.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

An electronic circuit-integrated motor device according to the first embodiment is provided for an electric power assist system such as an electric power steering system (EPS system), which is a power assist system.

Figure 6:
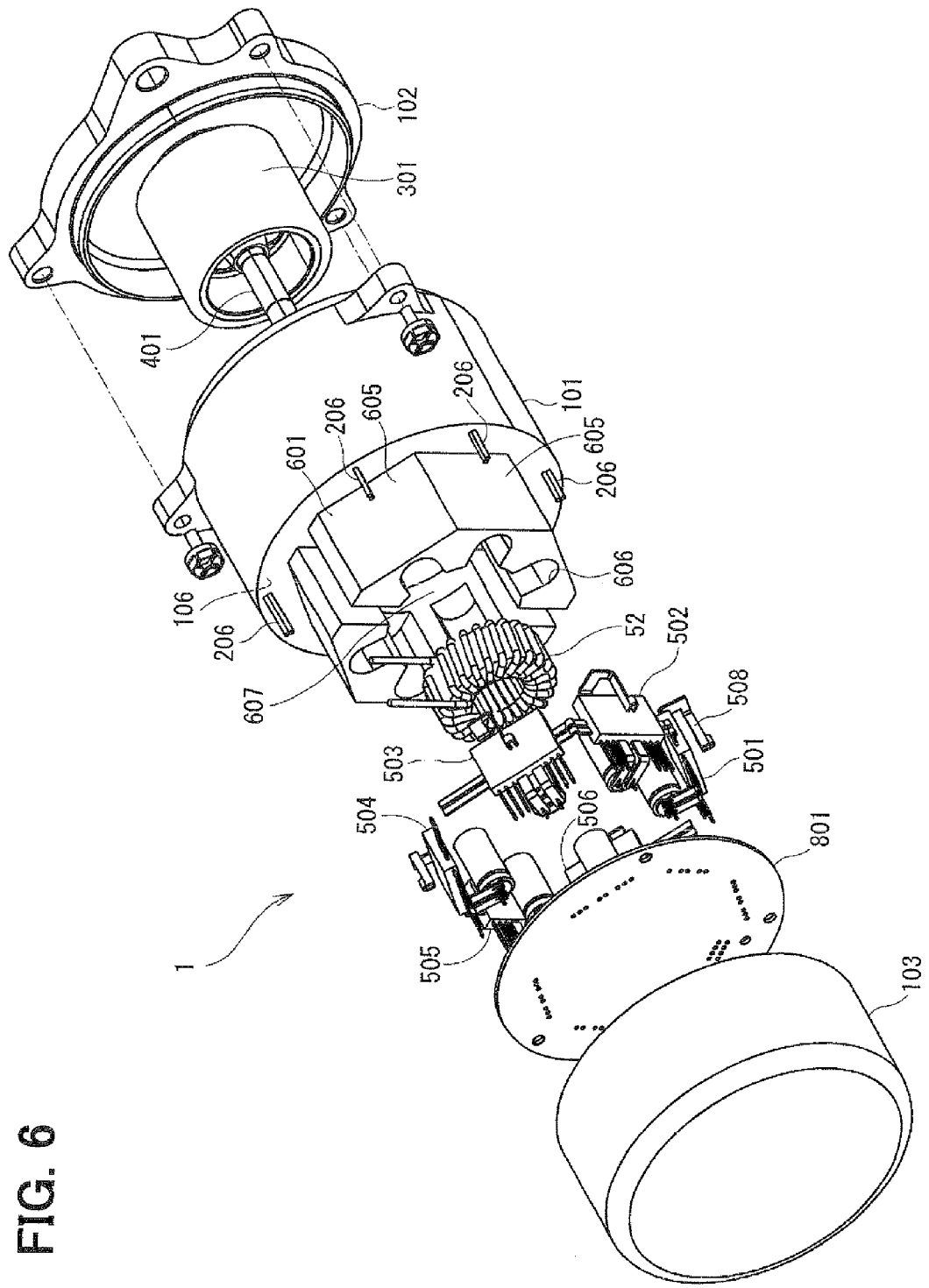
FIG. 6 is an exploded perspective view showing the electronic circuit-integrated motor device according to the first embodiment.

Referring to FIG. 6, an electronic circuit-integrated motor device 1 includes a motor 30, a power circuit 50 and a control circuit 70. The electronic circuit-integrated motor device 1 provides steering assist to a steering wheel 91 of a vehicle by generating a rotary torque for a column shaft 92 through a gear 93 mounted on the column shaft 92, which is a rotating shaft of the steering wheels 91. More specifically, when the steering wheel 91 is operated by a driver, a torque sensor 94 detects a steering torque that is generated for the column shaft 92 as a result of steering. Further, a vehicle speed signal is acquired from a CAN (control area network), which is not shown, to provide steering assist to the driver who steers the steering wheel 91. The use of the this mechanism, depending on the employed control method, will make it possible not only to provide steering assist, but also to provide automatic control of operations of the steering wheel 91 for the purpose, for instance, of causing the vehicle to stay in a traffic lane on an expressway or guiding the vehicle into a parking space in a parking lot.

The motor 30 is a brushless motor that rotates the gear 93 in a normal direction and in a reverse direction. The power circuit 50 supplies electrical power to the motor 30. The power circuit 50 includes a choke coil 52, which is positioned in a power supply cable from a power source 51, shunt resistors 53, 54, 55, aluminum electrolytic capacitors 56, 57, 58, and a set of two inverter circuits, that is, a first inverter circuit 60 and a second inverter circuit 68. As the first inverter circuit 60 and the second inverter circuit 68 have substantially the same circuit configuration, the first inverter circuit 60 will be mainly described below.

The first inverter circuit 60 includes seven metal oxide semiconductor field effect transistors (MOSFETs) 61, 62, 63, 64, 65, 66, 67, which are classified as one of a variety of types of field effect transistors. The MOSFETs 61 to 67 are switching elements. More specifically, the path between the source and drain of each MOSFET turns on (closes) or off (opens) depending on the electric potential applied to the gate.

The MOSFETs 61 to 67 are hereinafter referred to as FETs 61 to 67, respectively. The FETs 61 to 66 may be individually referred to as the FET (Su+) 61, FET (Sv+) 62, FET (Sw+) 63, FET (Su−) 64, FET (Sv−) 65, and FET (Sw−) 66. The FET 67 closest to the power source 51 is provided to protect the FETs 61 to 66 of the power circuit 50 from reverse connection of the power source 51. More specifically, the FET 67, which is connected in a direction opposite to that of the FETs 61 to 66, serves as a power relay that prevents an electrical current from flowing in a reverse direction when the power source 51 is erroneously connected in polarity.

The remaining six FETs 61 to 66 are described below. The FETs 61 to 66 are switching elements that change coil currents flowing to multiple-phase coils for driving the motor 30, that is, three-phase windings.

The gates of the FETs 61 to 66 are connected to six output terminals of a pre-driver circuit 71.

The drain of the FET (Su+) 61 is connected to the power supply cable, and the source thereof is connected to the drain of the FET (Su−) 64. The drain of the FET (Sv+) 62 is connected to the power supply cable, and the source thereof is connected to the drain of the FET (Sv−) 65. The drain of the FET (Sw+) 63 is connected to the power supply cable, and the source thereof is connected to the drain of the FET (Sw−) 66.

The drain of the FET (Su−) 64 is connected to the source of the FET (Su+) 61, and the source thereof is connected to the ground (ground cable). The drain of the FET (Sv−) 65 is connected to the source of the FET (Sv+) 62, and the source thereof is connected to the ground. The drain of the FET (Sw−) 66 is connected to the source of the FET (Sw+) 63, and the source thereof is connected to the ground.

Three connection points (junctions) between the series-connected FETs among FETs 61 to 66 are respectively connected to a U-phase coil, a V-phase coil, and a W-phase coil of the motor 30. More specifically, the junction between the FET (Su+) 61 and the FET (Su−) 64 is connected to the U-phase coil, the junction between the FET (Sv+) 62 and the FET (Sv−) 65 is connected to the V-phase coil, and the junction between the FET (Sw+) 63 and the FET (Sw−) 66 is connected to the W-phase coil.

It is noted that the FETs 61, 62 are packaged as a semiconductor module 501, the FETs 62, 65 are packaged as a semiconductor module 502, and the FETs 63, 66, 67 are packaged as a semiconductor module 503.

The aluminum electrolytic capacitor 56 is connected in parallel between the power supply cable of the FET (Su+) 61 and the ground of the FET (Su−) 64. Similarly, the aluminum electrolytic capacitor 57 is connected in parallel between the power supply cable of the FET (Sv+) 62 and the ground of the FET (Sv−) 65. The aluminum electrolytic capacitor 58 is connected in parallel between the power supply cable of the FET (Sw+) 63 and the ground of the FET (Sw−) 66. Each of the aluminum electrolytic capacitors 56 to 58 are simply referred to as the capacitor.

The choke coil 52 is provided to reduce power supply noise. The capacitors 56 to 58 store electrical charge to assist the supply of electrical power to the FETs 61 to 66 and suppress a surge voltage and other electric noise components. Even when an erroneous power source connection is made, the capacitors 56 to 58 are not damaged or broken, because the FET 67 is provided in series between the power source 51 and the inverter circuit 60 to provide protection against reverse connection.

The shunt resistors 53 to 55 are used to detect the currents flowing to the series-connected FETs.

The control circuit 70 includes the pre-driver circuit 7, a customized integrated circuit (custom IC) 72, a position sensor 73, a microcomputer 74, and a detected voltage amplifier circuit 77. The custom IC 72 includes two functional blocks, that is, a regulator circuit 75 and a position sensor signal amplifier circuit 76.

The regulator circuit 75 is a stabilization circuit that stabilizes the power source voltage. The regulator circuit 75 stabilizes the supply of electrical power to various units. For example, the regulator circuit 75 ensures that the microcomputer 74 operates on a predetermined stabilized supply voltage (e.g., 5 V).

The position sensor signal amplifier circuit 76 inputs a signal from the position sensor 73. The position sensor 73 is provided in the motor 30 and outputs a rotational position signal of the motor 30. The position sensor signal amplifier circuit 76 amplifies the rotational position signal and outputs the amplified rotational position signal to the microcomputer 74.

The detected voltage amplifier circuit 77 detects voltages across the shunt resistors 53 to 55 installed in the power circuit 50, amplifies the detected voltages indicative of the coil currents supplied to the motor 30, and outputs the amplified voltages to the microcomputer 74.

Consequently, the rotational position signal of the motor 30 and the voltages across the shunt resistors 53 to 55 are applied to the microcomputer 74. A steering torque signal is also applied to the microcomputer 74 from the torque sensor 94 mounted on the column shaft 92. In addition, the vehicle speed signal enters the microcomputer 74 through the CAN.

Upon receipt of the steering torque signal and the vehicle speed signal, the microcomputer 74 controls the inverter circuits 60, 68 through the pre-driver circuit 71 in accordance with the rotational position signal and in such a manner as to provide steering assist to the steering wheel 91 in accordance with vehicle speed. More specifically, the inverter circuits 60, 68 are controlled by turning on or off the FETs 61 to 66 through the pre-driver circuit 71. As the gates of the six FETs 61 to 66 are connected to the six output terminals of the pre-driver circuit 71, the pre-driver circuit 71 can change the potentials of the gates.

Further, the microcomputer 74 controls the inverter circuits 60, 68 in accordance with the voltages across the shunt resistors 53 to 55, which are input from the detected voltage amplifier circuit 77, so that the electrical current is supplied to the motor 30 in generally a sine wave form.

Each of the electrical and mechanical parts of the electronic circuit-integrated motor device 1 is arranged as shown in FIGS. 2 to 6.

Figure 4:
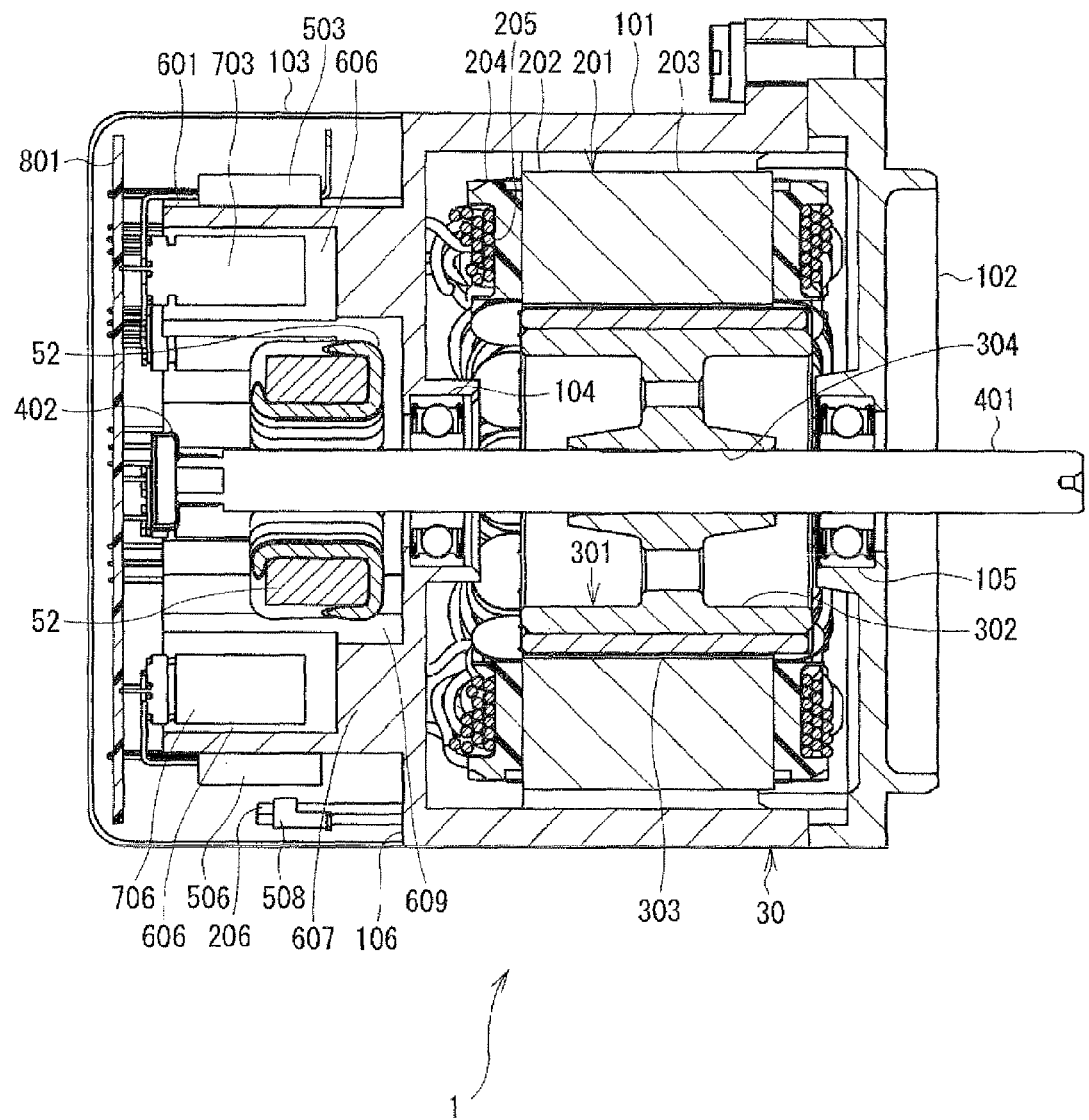
FIG. 4 is a cross-sectional view of the electronic circuit-integrated motor device taken along the line IV-IV in FIG. 3.

As best shown in FIG. 4, the electronic circuit-integrated motor device 1 has a motor housing that includes a tubular motor case 101, which is in a bottomed cylindrical shape having a cylindrical part and an end wall 106 at one axial end of the cylindrical part; an end frame 102, which is screw-fastened to the other axial end of the cylindrical part of the motor case 101; and a cover 103, which is in a bottomed cylindrical shape fitted over the end wall 106 to cover electronic circuit part therein. An electric connector (not shown) for connection to the power source 51 is attached to the cover 103. Electrical power is supplied to bus bars 16 to 19 through this connector.

The motor 30 also has a stator 201 positioned on the radially inside part of the motor case 101, a rotor 301 positioned on the radially inside part of the stator 201, and a shaft 401 that is fit firmly in the rotor 301 to rotate together with the rotor 301.

Figure 5:
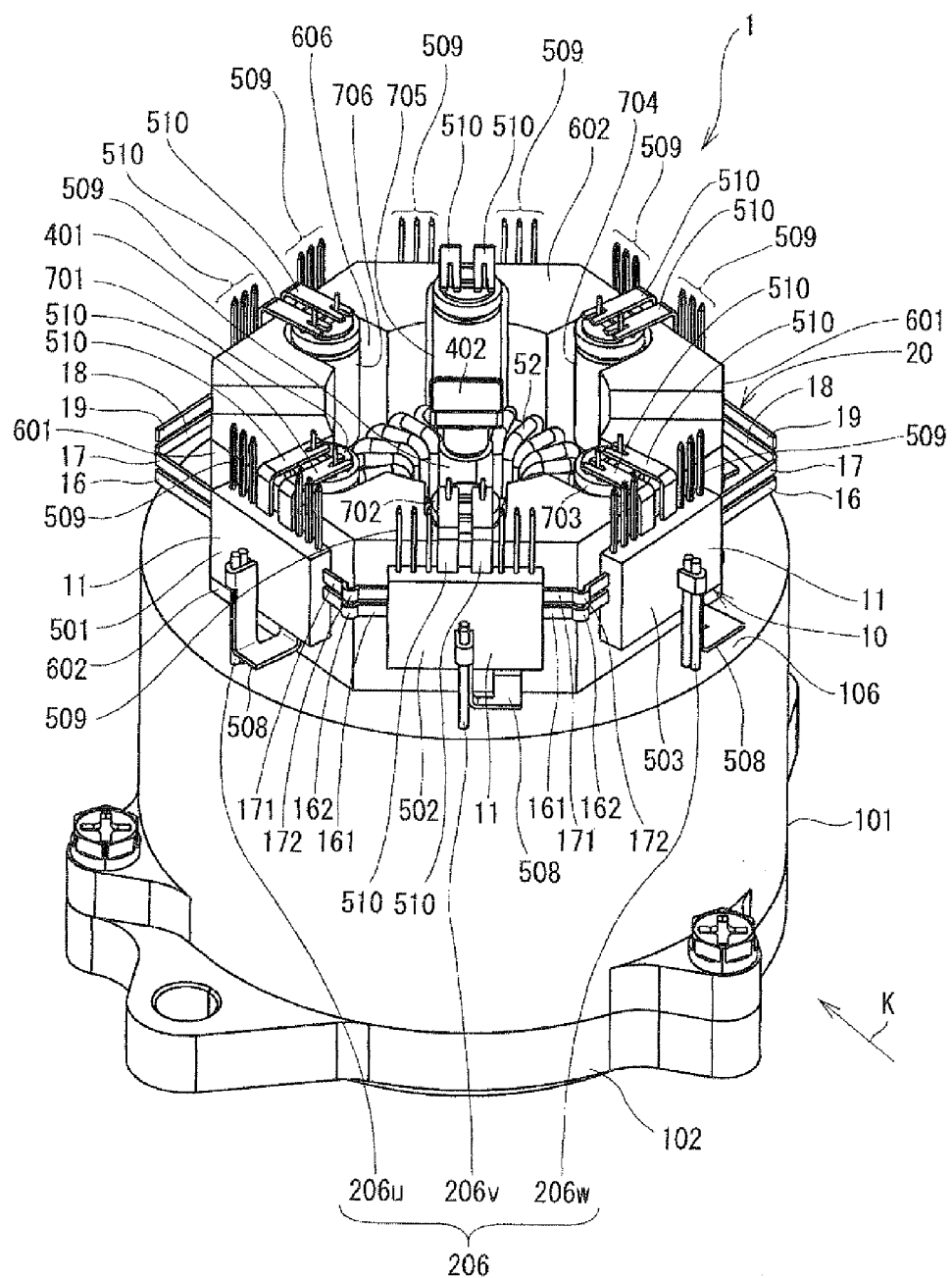
FIG. 5 is a perspective view showing the electronic circuit-integrated motor device according to the first embodiment.

The stator 201 includes twelve salient poles 202, which protrude in the radially inward direction of the motor case 101. The salient poles 202 are disposed at predetermined angular intervals in the circumferential direction of the motor case 101. The salient poles 202 each include a multilayer core 203, which is formed by a stack of thin magnetic plates, and an insulator 204, which fits with the axially outer end of the multilayer core 203. Coils (windings) 205 are wound on the insulator 204. Each of the coils 205 is a three-phase winding of a U-phase, a V-phase or a W-phase and has two sets of U-phase, V-phase or W-phase. Either the first inverter circuit 60 or the second inverter circuit 68 controls the supply of electrical power to the individual sets of U-phase, V-phase and W-phase. A lead wire 206 for supplying electrical power to the coil 205 is connected to six points of the coils 205 and routed toward the electronic circuit from six holes provide in the end wall 106 of the motor case 101. As described later, the lead wire 206 is routed from the axial end wall 106 of the motor case 101 to the radially outside part of semiconductor modules 501 to 506, as shown in FIGS. 4 and 5. In a radially outer space of the semiconductor modules 501 to 506, the lead wire 206 and coil terminal 508 are electrically connected as exemplarily shown in FIGS. 4 and 5 in such a manner that the lead wire 206 is clamped in the coil terminal 508. It is noted that the lead wire 206 is shown as two wires, assuming that the coils 205 are connected in the Δ-shape.

Specifically, the coil terminal 508 of the semiconductor module 501 is connected to a U-phase lead wire 206*u* of the first inverter circuit 60. The semiconductor module 501 is thus connected to the U-phase of the coils 205 to turn on and off the current supply to the U-phase coil. The coil terminal 508 of the semiconductor module 502 is connected to a V-phase lead wire 206*v* of the first inverter circuit 60. The semiconductor module 502 is thus connected to the V-phase of the coils 205 to turn on and off the current supply to the V-phase coil. The coil terminal 508 of the semiconductor module 502 is connected to a W-phase lead wire 206*w* of the first inverter circuit 60. The semiconductor module 503 is thus connected to the W-phase of the coils 205 to turn on and off the current supply to the V-phase coil.

Similarly, the coil terminal 508 of the semiconductor module 504 is connected to a U-phase lead wire 206*u* of the second inverter circuit 68. The semiconductor module 504 is thus connected to the U-phase of the coils 205 to turn on and off the current supply to the U-phase coil. The coil terminal 508 of the semiconductor module 505 is connected to a V-phase lead wire 206v of the second inverter circuit 68. The semiconductor module 505 is thus connected to the V-phase of the coils 205 to turn on and off the current supply to the V-phase coil. The coil terminal 508 of the semiconductor module 506 is connected to a W-phase lead wire 206w of the second inverter circuit 68. The semiconductor module 506 is thus connected to the W-phase of the coils 205 to turn on and off the current supply to the W-phase coil. The lead wires 206, 206 and 206w correspond to the lead wire 206.

The rotor 301 is made, for instance, of iron or other magnetic materials and formed into cylindrical shape. The rotor 301 includes a rotor core 302 and permanent magnets 303 that are fixed to the radially outside part of the rotor core 302. The permanent magnets 303 include a total of ten poles, more specifically, five N poles and five S poles, which are alternately disposed in the circumferential direction.

The shaft 401 is fixedly fastened to a shaft hole 304 formed at the radial center of the rotor core 302. The shaft 401 is rotatably supported by a bearing 104 on the end wall 106 of the motor case 101 and by a bearing 105 on the end frame 102. This ensures that the shaft 401 can rotate together with the rotor 301 with respect to the stator 201. The shaft 401 extends toward the electronic circuit section. The top end of the shaft 401 that is positioned toward the electronic circuit section is provided with a magnet 402 for detecting the rotational position. A printed circuit board 801, which is made of resin, is positioned near the top end of the shaft 401 that is positioned toward the electronic circuit section. The printed circuit board 801 is positioned in a space between the cover 103 and a heat sink 601 that is formed integrally with the motor case 101. The control circuit 70 (shown in FIG. 1) is formed on the printed circuit board 801. More specifically, a conductive wiring pattern is formed on the printed circuit board 801 by etching or other method, and an IC or other circuit forming the control circuit 70 is mounted on the printed circuit board 801. The position sensor 73 (shown in FIG. 1) is also mounted at the center of the printed circuit board 801. The position sensor 73 detects the rotational position of the magnet 402, that is, the rotational position of the shaft 401. A virtual straight line obtained by extending the central axis of the shaft 401 is referred to as the rotation axis of the motor 30.

As shown in FIGS. 2 to 6, particularly in FIG. 6, the heat sink 601 is formed on the motor case 101. The heat sink 601 is formed on the axial end wall 106 of the motor case 101 in a raised or protruded manner. The heat sink 601 is formed integrally with the motor case 101 and extends in the axial direction of the shaft 401 toward the printed circuit board 801. The heat sink 601 includes two columnar members 602. Their cross sections, which are perpendicular to the axial direction of the shaft 401, are substantially trapezoidal in shape. The two columnar members 602 are disposed in such a manner that the rotation axis of the motor 30 is sandwiched therebetween as exemplified in FIG. 2. Further, the columnar members 602 each have an arc portion 609 that is cut to form an arc around the rotation axis of the motor 30. The arc portion 609 forms a cylindrical space at the center of the heat sink 601. That is, the heat sink 601 is formed in a shape, which is like a thick-walled cylinder that is octagon-shaped when viewed in the axial direction. Obviously, the heat sink 601 need not always be octagon-shaped when viewed in the axial direction. Alternatively, it may be hexagon-shaped when viewed in the axial direction. The two columnar members 602 are formed so that they are not contiguous. A portion that makes the columnar members 602 noncontiguous includes the arc portion 609, which is cut to form an arc around the rotation axis of the motor 30 and planar cut surfaces 603, 604, which are formed on both sides of the arc portion 609.

The columnar members 602 of the heat sink 601 have outer side wall surfaces 605, which are wider than a side wall surface that faces in a radially outward direction and contiguous with the cut surfaces 603, 604. A total of six radially outer side wall surfaces 605 are formed circumferentially. Accommodation sections 606 are formed as recesses in a position that corresponds to the radially inside part of the columnar members 602 and to each side wall surface 605. The accommodation sections 606 are open to the cylindrical space around the rotation axis of the motor 30, which is formed by the arc portion 609. The accommodation sections 606 have arc surfaces that define the radially outside parts of the accommodation sections 606 and fit to the outside diameters of capacitors 701 to 706. Further, the accommodation sections 606 are in a position that corresponds to the position of the side wall surfaces 605, and formed opposite the semiconductor modules 501 to 506 with the columnar members 602 positioned between the accommodation sections 606 and the semiconductor modules 501 to 506. Although a portion of the heat sink 601, at which the accommodation sections 606 are formed, is thinned, a thick portion 607, which is as thick as a portion where the accommodation sections 606 are not positioned, is formed between the accommodation sections 606 and the end wall 106 of the motor case 101 as shown in FIG. 4.

Figure 8:
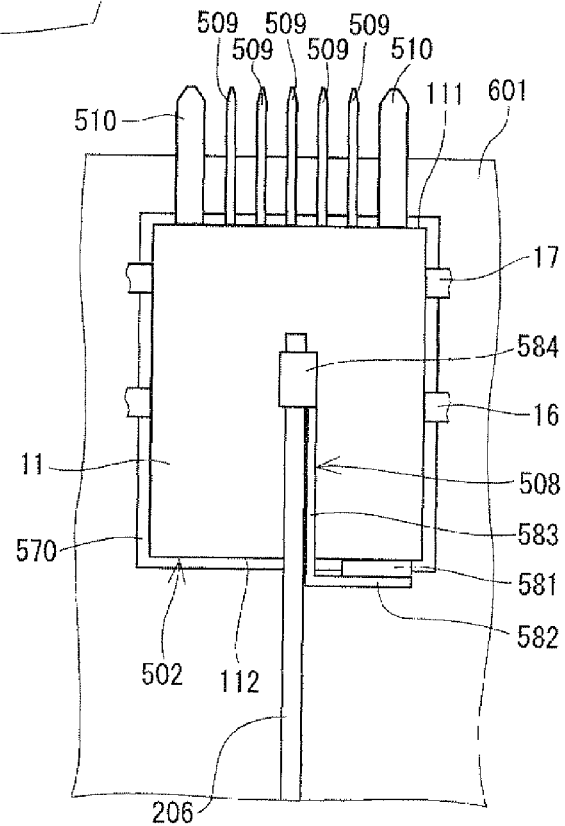
FIG. 8 is a front view showing the semiconductor module used in the first embodiment.
Figure 9:
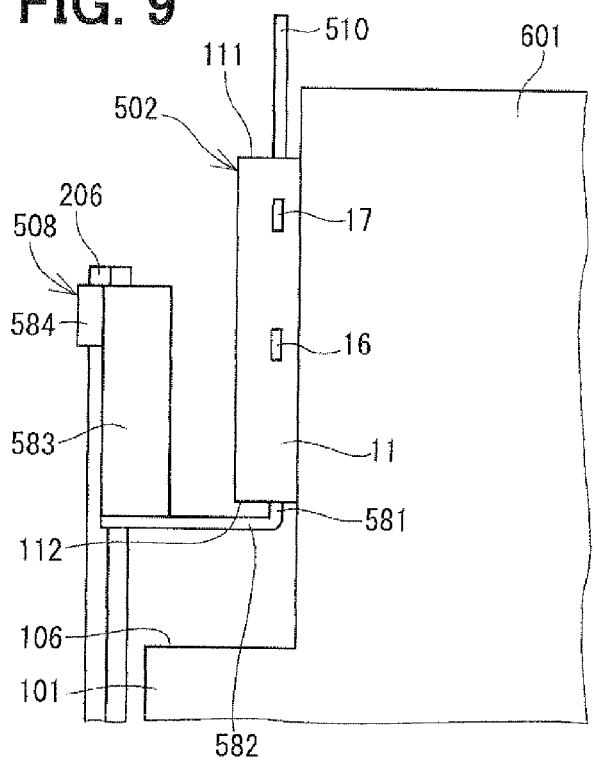
FIG. 9 is a side view showing the semiconductor module used in the first embodiment.
Figure 10:
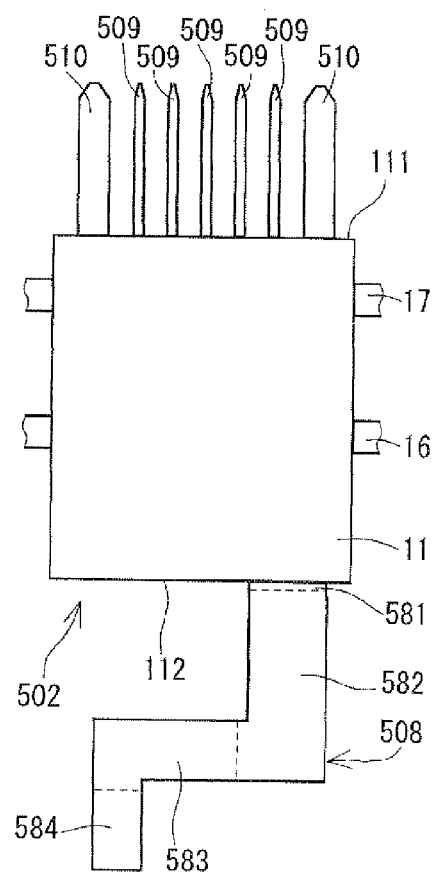
FIG. 10 is a front view showing a coil terminal of the semiconductor module before being bent to be used in the first embodiment.

As shown in FIG. 5, the semiconductor modules 501 to 506 are disposed on the side wall surfaces 605, which face the radially outside part of the heat sink 601. If necessary, the semiconductor modules 501 to 506 will be individually referred to as a U1 semiconductor module 501, a V1 semiconductor module 502, a W1 semiconductor module 503, a U2 semiconductor module 504, a V2 semiconductor module 505, and a W2 semiconductor module 506. The semiconductor modules 501 to 503 of the first inverter circuit 60 are linked by a first bus bar 16 and a second bus bar 17 to form a first linked semiconductor module unit 10. The semiconductor modules 504 to 506 of the second inverter circuit 68 are linked by a first bus bar 18 and a second bus bar 19 to form a second linked semiconductor module unit 20. The semiconductor modules 501 to 506 include the coil terminals 508, control terminals 509 and capacitor terminals 510. The coil terminals 508 are for connection to the phase coils of the motor 30 and mounted on a bottom side wall surface 112 toward the motor case 101 in a protruding manner and bent toward the radially outside part as shown in FIGS. 8 to 10. The control terminals 509, which are for connection to the control circuit 70, and the capacitor terminals 510, which are for connection to the capacitors 56 to 58, are mounted on a top side wall surface 111 opposite the motor case 101 in a protruding manner toward the cover 103. The linked semiconductor module units 10, 20 are formed by the semiconductor modules 501 to 506 as follows.

The semiconductor modules 501 to 506 are mounted on the heat sink 601, which is mounted on the axial end wall 106 of the motor case 101 in an axially raised or protruded manner. The semiconductor modules 501 to 506 are disposed, one by one, on the side wall surfaces 605, which face the radially outside wall surfaces of the heat sink 601. The bus bars 16, 17 for the linked semiconductor module unit 10 are bent so that the linked semiconductor module unit 10 formed by the semiconductor modules 501 to 503 is positioned around the rotation axis of the motor 30 to surround the shaft 401 and the heat sink 601 in the circumferential direction as shown in FIG. 5. Similarly, the bus bars 18, 19 for the linked semiconductor module unit 20 are bent so that the linked semiconductor module unit 20 formed by the semiconductor modules 504 to 506 are positioned around the rotation axis of the motor 30 to surround the shaft 401 and the heat sink 601. The semiconductor modules 501 to 506 are shaped like a thin wail plate in the form of a cuboid or a rectangular solid that is extended in the planar direction of a molded semiconductor chip. One of the six surfaces having a relatively large area, for example the largest area, serves as a heat dissipation surface.

Figure 19:
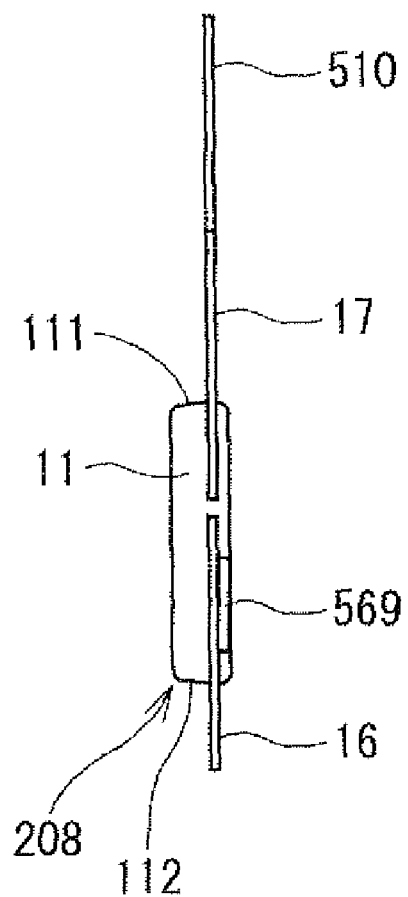
FIG. 19 is a side view showing the linked semiconductor module unit used in the second embodiment.

A heat dissipation portion 569 is exposed from the heat dissipation surface as shown in FIG. 19. The semiconductor modules 501 to 506 are disposed in such a manner that the heat dissipation surface is in planar contact with the side wall surfaces 605 of the heat sink 601. In this instance, the side wall surfaces 605 are plane surfaces. Accordingly, the heat dissipation surfaces of the semiconductor modules 501 to 506 are also plane surfaces. A heat dissipation insulation sheet (not shown) is placed between the semiconductor modules 501 to 506 and the heat sink 601 to provide electric insulation between the heat dissipation portion 569 and the heat sink 601. Even when the heat dissipation insulation sheet or other similar sheet-shaped member is placed between the semiconductor modules 501 to 506 and the heat sink 601 to provide an indirect contact, it is assumed that the semiconductor modules 501 to 506 are in planar contact with the heat sink 601.

As the semiconductor modules 501 to 506 are disposed on the side wall surfaces 605 of the heat sink 601, the line perpendicular to a semiconductor chip surface is perpendicular to the central axis of the shaft 401. That is, the semiconductor modules 501 to 506 are perpendicularly disposed.

Figure 2:
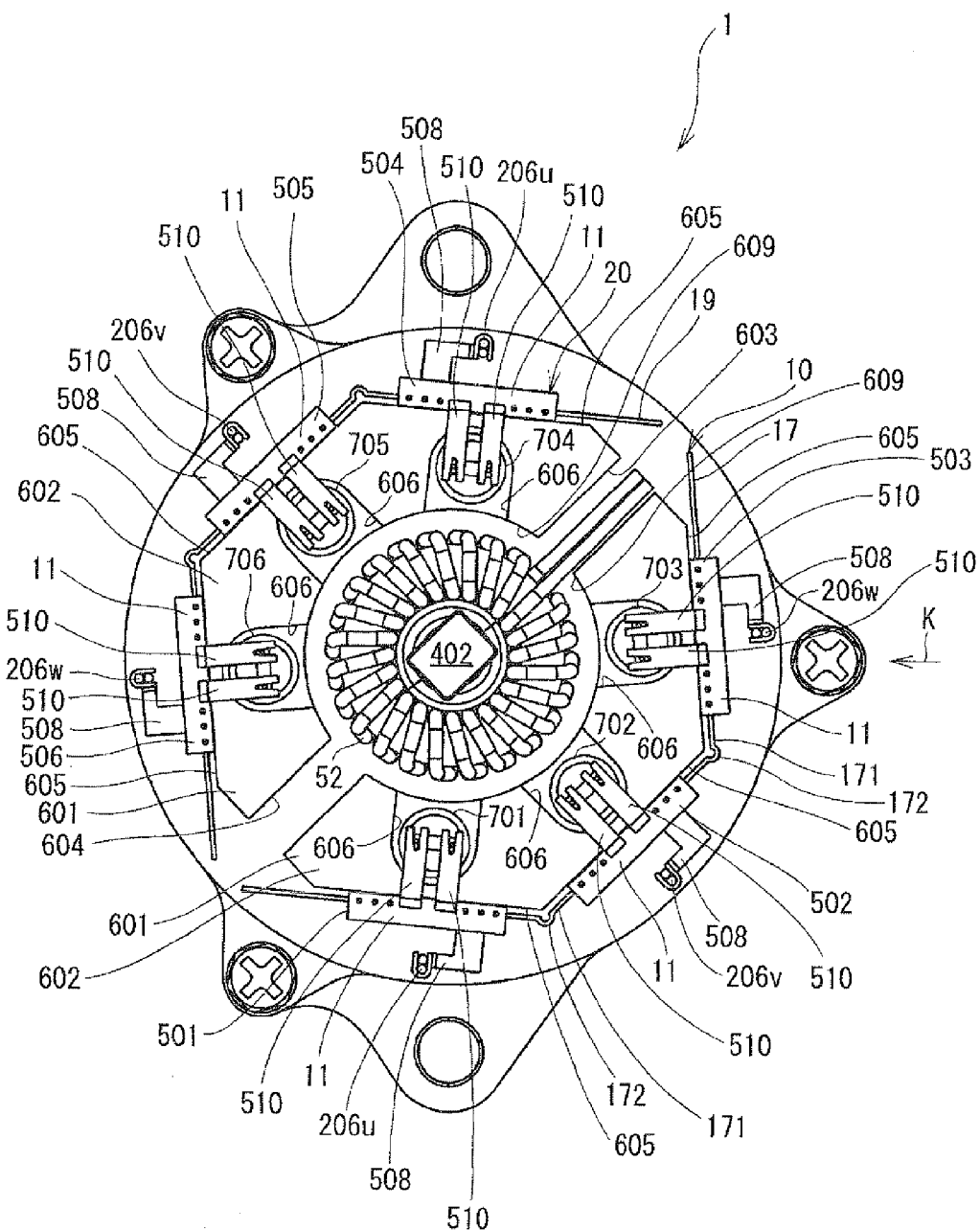
FIG. 2 is a top plan view showing an electronic circuit-integrated motor device according to the first embodiment of the present invention.
Figure 3:
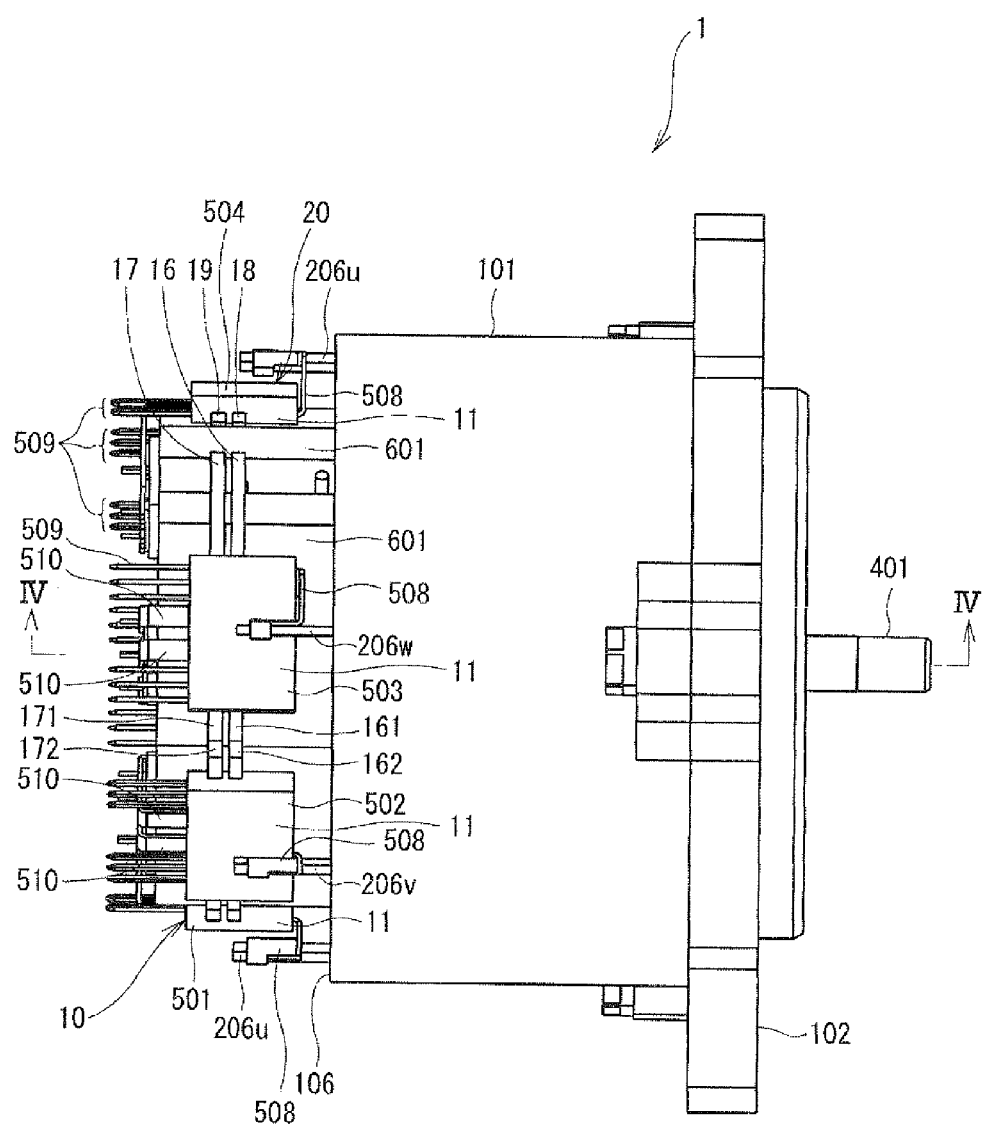
FIG. 3 is a side view showing the electronic circuit-integrated motor device according to the first embodiment.

The accommodation sections 606 of the heat sink 601 house the capacitors 701, 702, 703, 704, 705, 706, respectively, as shown in FIGS. 2 and 4. When necessary, the capacitors 701 to 706 will be individually referred to as a U1 capacitor 701, a V1 capacitor 702, a W1 capacitor 703, a U2 capacitor 704, a V2 capacitor 705, and a W2 capacitor 706. The capacitors 701 to 703 are provided for the first inverter circuit 60, whereas the capacitors 704 to 706 are provided for the second inverter circuit 68. The U1 capacitor 701 corresponds to the capacitor 56. The V1 capacitor 702 corresponds to the capacitor 57 shown in FIG. 6. The W1 capacitor 703 corresponds to the capacitor 58. As for the second inverter circuit 68, the U2 capacitor 704 is a U-phase capacitor, the V2 capacitor 705 is a V-phase capacitor, and the W2 capacitor 706 is a W-phase capacitor.

The capacitors 701 to 706 are housed in the accommodation sections 606 of the heat sink 601 and respectively positioned near the semiconductor modules 501 to 506, which are disposed in a radially inward direction, while the heat sink 601 is clamped between the capacitors 701 to 706 and the semiconductor modules 501 to 506. The capacitors 701 to 706 are cylindrical in shape and disposed in such a manner that their axes are parallel to the central axis of the shaft 401. Further, the capacitors 701 to 706, which are positioned outside a resin part 11 of each module 501 to 506, are directly connected to the capacitor terminals 510 of the semiconductor modules 501 to 506. More specifically, the U1 semiconductor module 501 is connected to the U1 capacitor 701, the V1 semiconductor module 502 is connected to the V1 capacitor 702, and the W1 semiconductor module 503 is connected to the W1 capacitor 703. In addition, the U2 semiconductor module 504 is connected to the U2 capacitor 704, the V2 semiconductor module 505 is connected to the V2 capacitor 705, and the W2 semiconductor module 506 is connected to the W2 capacitor 706.

The shaft 401 is protruded from the end wall 106 toward the electronic circuit section including the printed circuit board 801 as shown in FIG. 4. As shown, for instance, in FIGS. 2 and 4, the choke coil 52 is disposed in such a manner that the shaft 401 is inserted through the choke coil 52. Thus, the choke coil 52 surrounds the shaft 401 circumferentially. The choke coil 52 is placed in a cylindrical space that is formed by the arc portion 609 formed at the radial center of the heat sink 601. The choke coil 52 is formed by winding a coil wire around a doughnut-shaped iron core. The coil ends of the choke coil 52 are passed between the cut surfaces 603 of the columnar members 602 and routed out in the radially outward direction.

Figure 1:
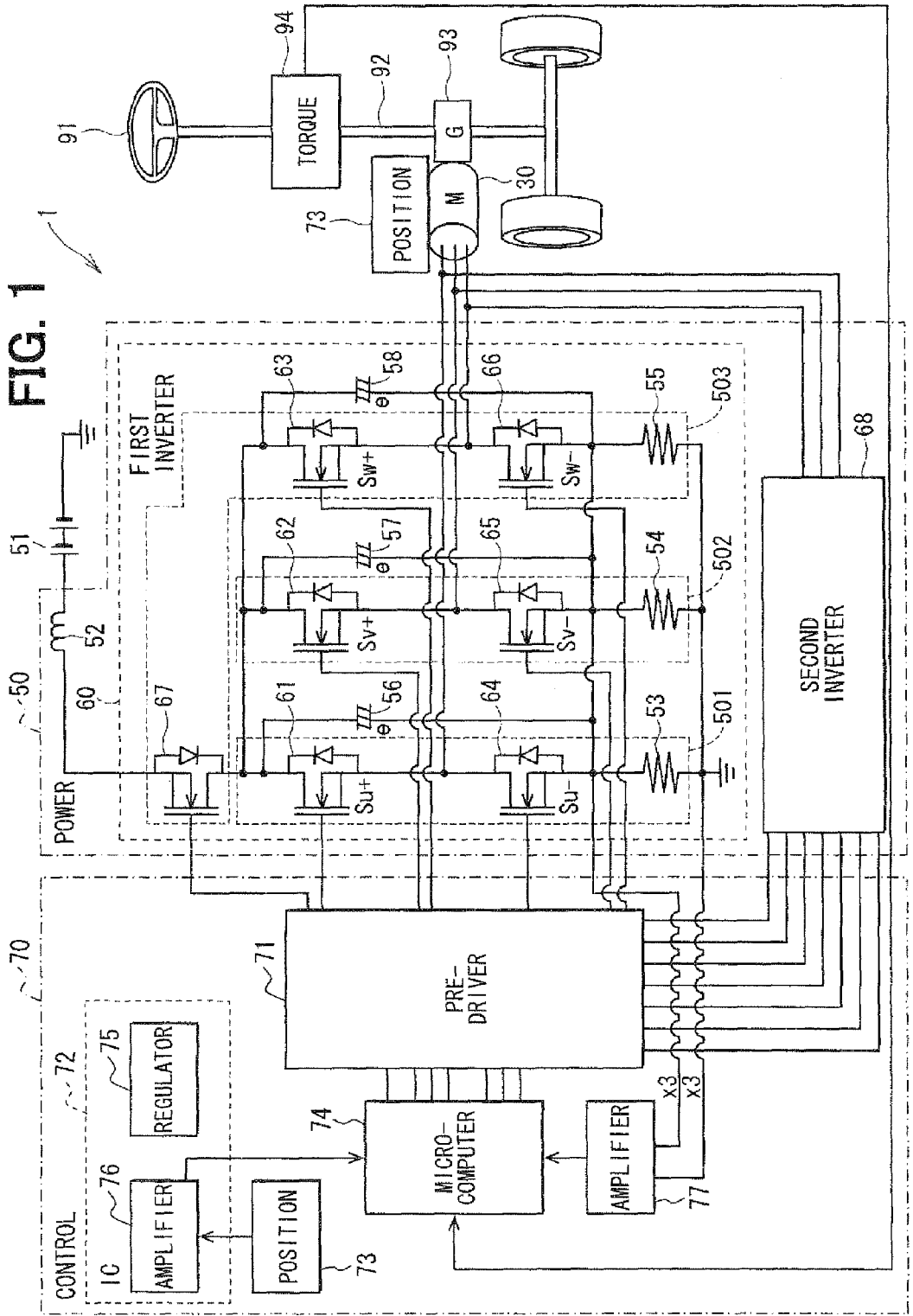
FIG. 1 is an electric circuit diagram showing an electric power steering system of a vehicle.

The coil ends of the choke coil 52 are connected to the power supply cable in series as understood in FIG. 1.

The connections between the coil terminal 508 and the lead wire 206, the semiconductor modules 501 to 506, the heat sink 601, the capacitors 701 to 706, and the choke coil 52 are sequentially arranged in the order named within the outside diameter range of the motor case 101, in the radially inward direction from the radially outside to the radially inside, to make effective use of the radial space.

Meanwhile, the power circuit 50 and the control circuit 70 are obviously required to exercise drive control over the motor 30. The power circuit 50 and the control circuit 70 are configured to form an electronic control unit (ECU). The electronic circuit-integrated motor device 1 is characterized by the internal configuration of the ECU.

The motor 30 used for the EPS system generates an output of approximately 500 W to 2 kW. The physical space occupied by the power circuit 50 and the control circuit 70 is approximately 20 to 40% of the entire electronic circuit-integrated motor device 1. Further, as the motor 30 needs to generate a large output, the power circuit 50 tends to be large in size. Therefore, the power circuit 50 occupies more than 70% of the region occupied by the power circuit 50 and the control circuit 70.

Large parts forming the power circuit 50 are the choke coil 52, the capacitors 56 to 58, and the FETs 61 to 67.

First of all, the semiconductor modules 501 to 506 having the FETs 61 to 67 will be described. As shown in FIG. 1, the semiconductor modules 501 to 503 form the first inverter circuit 60, whereas the semiconductor modules 504 to 506 form the second inverter circuit 68. More specifically, the U1, V1, and W1 semiconductor modules 501 to 503 form the first inverter circuit 60, whereas the U2, V2, and W2 semiconductor modules 504 to 506 form the second inverter circuit 68. The U1 semiconductor module 501 includes the FETs 61, 64, which are for the U-phase. The V1 semiconductor module 502 includes the FETs 62, 65, which are for the V-phase. The W1 semiconductor module 503 includes the FETs 63, 66, which are for the W-phase, and the FET 67, which is for protection against reverse connection.

The linked semiconductor module unit 10 is formed as the first bus bar 16 and the second bus bar 17 link the semiconductor modules 501 to 503 having the FETs 61 to 67. In addition, the linked semiconductor module unit 20 is formed as the first bus bar 18 and the second bus bar 19 link the semiconductor modules 504 to 506 having the FETs 61 to 67.

As shown in FIG. 5, the linked semiconductor module unit 10 is formed as the U1 semiconductor module 501, the V1 semiconductor module 502, and the W1 semiconductor module 503 are coupled by the first bus bar 16, which is a first conductive member, and the second bus bar 17, which is a second conductive member. Further, the linked semiconductor module unit 20 is formed as the U2 semiconductor module 504, the V2 semiconductor module 505, and the W2 semiconductor module 506 are coupled by the first bus bar 18, which is a first conductive member, and the second bus bar 19, which is a second conductive member. The first bus bars 16, 18 are connected to the power supply cable (positive polarity side of the power source 51), whereas the second bus bars 17, 19 are connected to the ground (negative polarity side of the power source 51). Therefore, electrical power is supplied to the semiconductor modules 501 to 506 through the bus bars 16 to 19. The bus bars 16 to 19 thus couple the semiconductor modules 501 to 506 not only mechanically, but electrically as well. The linked semiconductor module unit 10 forms the first inverter circuit 60 shown in FIG. 1, whereas the linked semiconductor module unit 20 forms the second inverter circuit 68 shown in FIG. 1. The electronic circuit-integrated motor device 1 includes the two inverter circuits 60, 68. This ensures that the currents flowing to the inverter circuits 60, 68 are each reduced to one half. It should also be noted that the bus bars 16 to 19 form a linking member.

The linked semiconductor module 10 is described in more detail. The semiconductor module 20 is in substantially the same configuration. As shown in FIG. 5, the first bus bar 16 has an embedded part (not shown), which is embedded in the resin part 11 of the U1 semiconductor module 501, the V1 semiconductor module 502 and the W1 semiconductor module 503, and an exposed part 161, which is not embedded in the resin part 11. The embedded part and the exposed part 161 are formed contiguously as a single member. The exposed part 161 has a bent part 162, which is formed to bulge in an arc from the linear part. Similarly, the second bus bar 17 has an embedded part (not shown), which is embedded in the resin part 11, and an exposed part 171, which is not embedded in the resin part 11. The embedded part and the exposed part 171 are formed contiguously as a single member. The exposed part 171 has a bent part 172, which is formed to bulge in an arc from the linear part.

The first bus bar 16 and the second bus bar 17 are thus bendable at the bent parts 162 and 172, respectively. As shown in FIGS. 2 to 5, the semiconductor modules 501 to 503 are arranged to be in planar contact with the side wall surfaces 605 of the heat sink 601 at the radially outside part of the heat sink 601. Thus, heat dissipation is promoted. Since the exposed parts 161 and 171 have the respective bent parts 162 and 172, which are formed in the arc shape, the stress generated when the bus bars 16 and 17 are bent is prevented from concentrating. Thus, the resin part 11 is protected from being damaged.

As shown in FIGS. 2 to 5, the linked semiconductor modules 10 and 20 are arranged longitudinally so that its coil terminal 508 is located at the motor case 101 side and the capacitor terminals 510 and the control terminals 509 are located at the printed circuit board 801 side. Thus, the semiconductor modules 501 to 506 are located between the motor case 101 and the printed circuit board 801.

Each of the semiconductor modules 501 to 506 has the capacitor terminals 510 and the control terminals 509, which protrude generally perpendicularly from the top side wall surface 111 of the resin part 11, which faces the printed circuit board 801 and is opposite to the end wall 106. The capacitor terminals 510 are bend radially inward along the heat sink 601 and connected directly to the terminals of the corresponding one of the capacitors 701 to 706. Thus, the semiconductor modules 501 to 506 and the capacitors 701 to 706 are directly connected without separate members such as a printed circuit board. The top ends the control terminals 509 are inserted into the through holes of the printed circuit board 901 (FIGS. 4, 6), which forms the control circuit 70 (FIG. 1), and soldered so that the semiconductor modules 501 to 506 are electrically connected to the control circuit 70.

The coil terminal 508 is described in more detail with reference to the V1 semiconductor module 502, as an example, shown in FIGS. 7 to 10.

Figure 7:
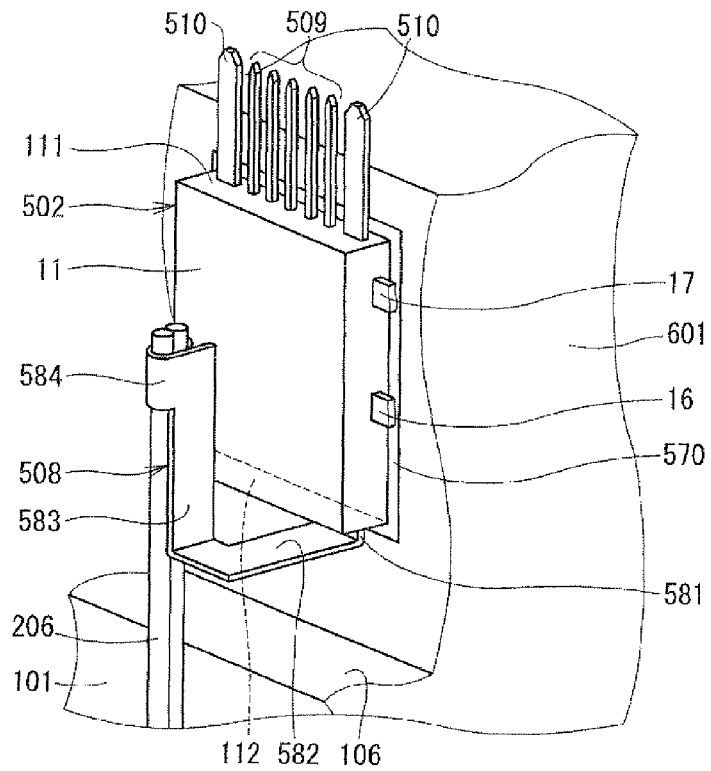
FIG. 7 is a perspective view showing a semiconductor module used in the first embodiment.

In case that the V1 semiconductor module 502 is arranged longitudinally in the electronic circuit-integrated motor device 1, the coil terminal 508 provided on the bottom side wall surface 112 of the resin part 11, which is on the motor case 101 side, is bent at three positions indicated by dotted lines in FIG. 10 and clamps the lead wire 206 of the coil 205. As shown in FIGS. 7 to 9, the coil terminal 508 has a droop part 581, an intermediate part 582, a rise part 583 and a connection part 584. The droop part 581, the intermediate part 582, the rise part 583 and the connection part 584 are formed integrally as a single conductive member.

The droop part 581 is protruded from the bottom side wall surface 112 of the resin part 11, which faces the end wall 106 of the motor case 101, generally perpendicularly from one end part (right end part in FIG. 7), when the resin part 11 is provided in the electronic circuit-integrated motor device 1. The droop part 581 is smaller than the intermediate part 582, the rise part 583 and the like. Specifically, the coil terminal 508 is bent about 90 degrees in the radially outward direction (direction of thickness of the resin part 11), that is, in the direction leaving the heat sink 601, to extend in parallel to the bottom side wall surface 112 facing the end wall 106. The intermediate part 582 is bent at a position as near as possible to the resin part 11 with a certain gap from the bottom side wall surface 112 not to damage the resin part 11. The intermediate part 582 thus extends in parallel to the bottom side wall surface 112. The droop part 581 is located at a position deviated toward the right corner from the width center of the resin part 11 as shown in FIGS. 7 and 10.

The intermediate part 582 is bent about 90 degrees in the direction of thickness of the resin part 11 from the droop part 581. The intermediate part 582 is formed in an L-shape before being bent to extend in the circumferential direction from the part, which extends in the radially outward direction (from right to left in FIGS. 7 and 10), in case the semiconductor module 502 is arranged in the electronic circuit-integrated motor device 1. The intermediate part 582 is in parallel to the end wall 106 of the motor case 101.

The rise part 583 is bent about 90 degrees from the circumferentially extending part of the intermediate part 582 to rise in the direction leaving from the end wall 106 of the motor case 101. The rise part 583 and the droop part 581 are parallel but positioned at different locations, which are deviated from each other in the direction of width (left and right) of the resin part 11. The connection part 584 is formed at the top end of the rise part 583 and bent in a U-shape, which opens toward the heat sink 601 and the resin part 11. The connection part 584 is bent to clamp the lead wire of the coil 205, which is taken out in the axial direction of the motor case 101 through the hole (not shown) formed in the end wall 106. The connection part 584 and the lead wire 206 are electrically connected by welding. Thus, the coil terminal 508 and the lead wire 206 of the coil 205 are directly connected.

Figure 13:
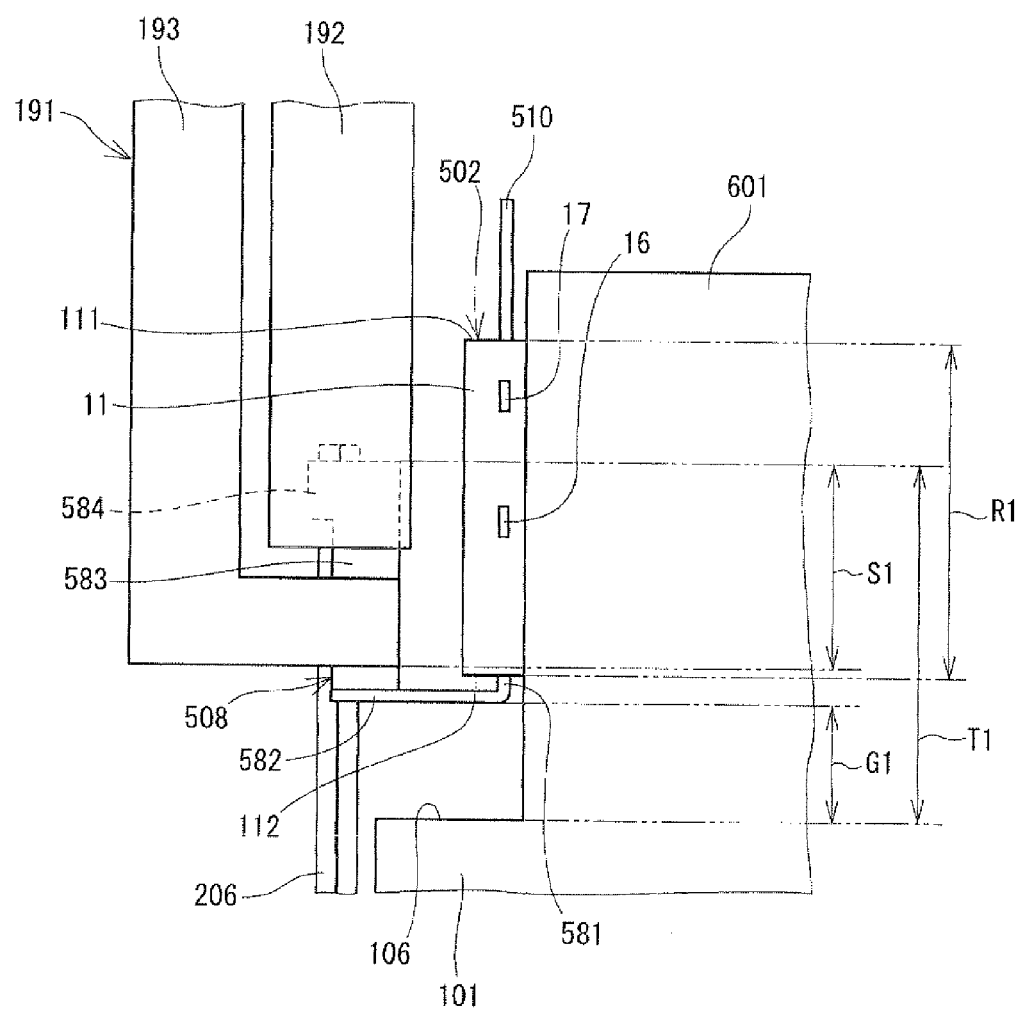
FIG. 13 is a side view showing the welding jig and the semiconductor module used in the first embodiment.
Figure 14:
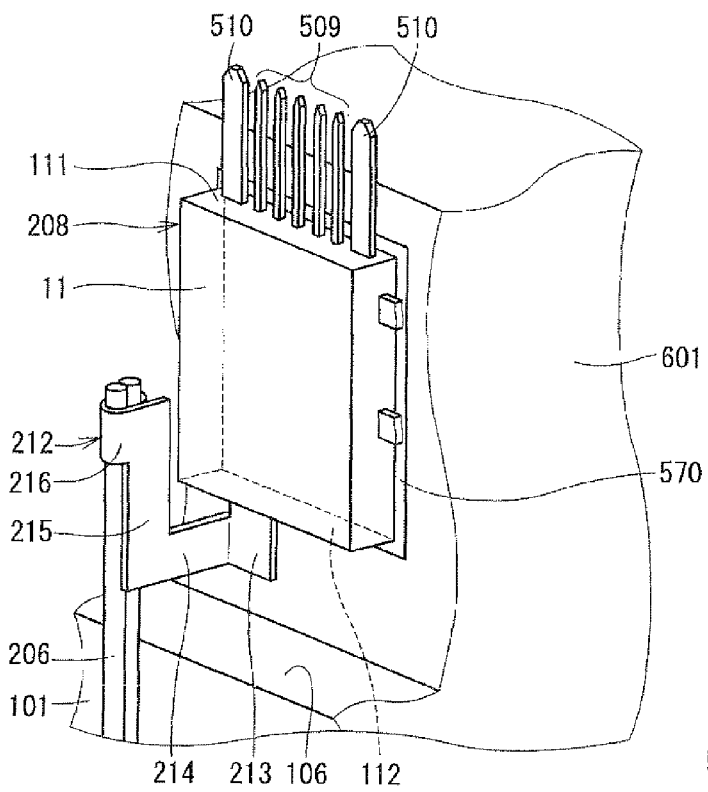
FIG. 14 is a perspective view showing a semiconductor module used in an electronic circuit-integrated motor device according to the second embodiment of the present invention.
Figure 15:
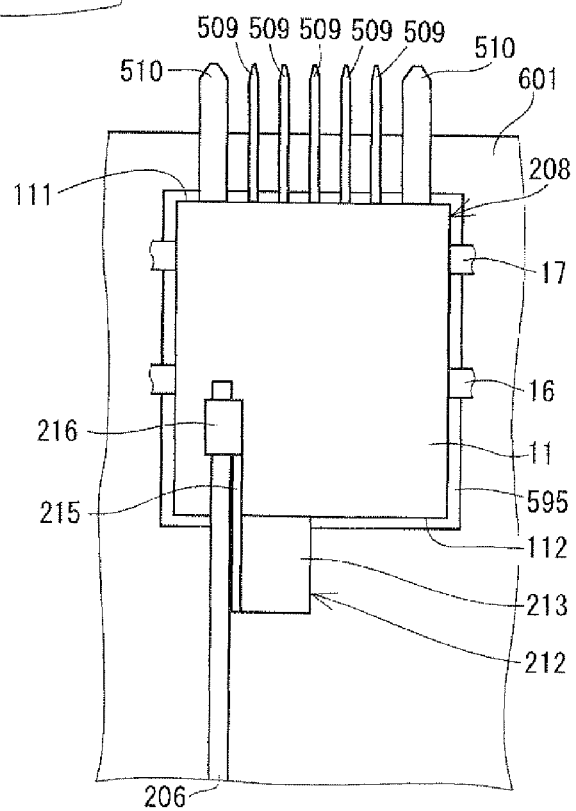
FIG. 15 is a front view showing the semiconductor module used in the second embodiment.
Figure 16:
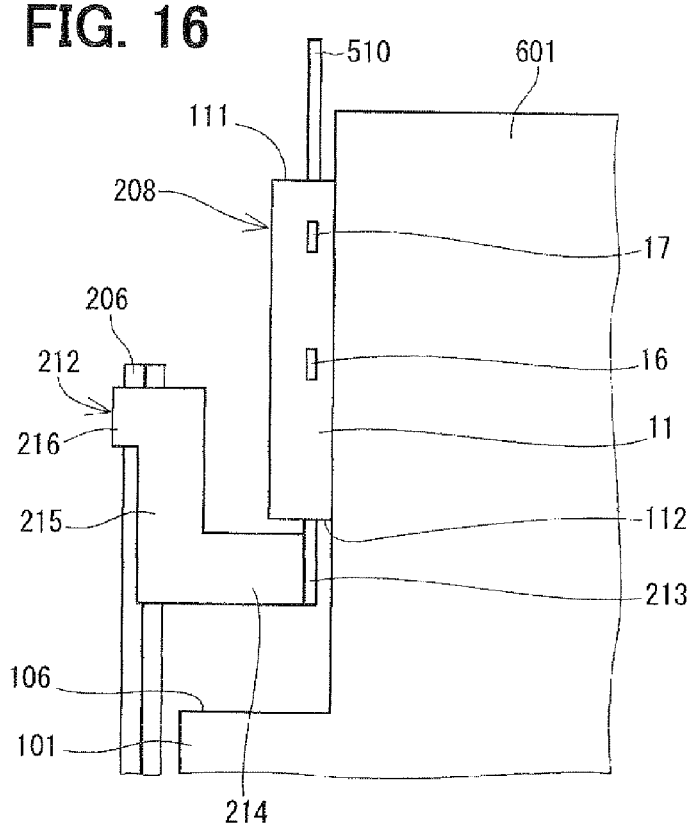
FIG. 16 is a side view showing the semiconductor module used in the second embodiment.

The intermediate part 582 is spaced apart from the end wall 106 of the motor case 101 to provide a coil-case gap region G1 as shown in FIG. 13. This coil-case gap region G1 ensures insulation between the coil terminal 508 and the end wall 106 of the motor case 108.

In case that the semiconductor modules 501 to 506 are arranged within the motor device 1, the connection part 584 of the coil terminal 508 is positioned between the bottom side wall surface 112 of the resin part 11, which faces the motor case 101, and the top side wall surface 111 of the resin part 11, which faces the printed circuit board 801 and does not face the end wall 106. The bottom side wall surface 112 of the resin part 11 is referred to as an end part at the motor case side, and the top side wall surface 111 of the resin part 11 is referred to as an end part at the counter-motor case 101 side.

Figure 11:
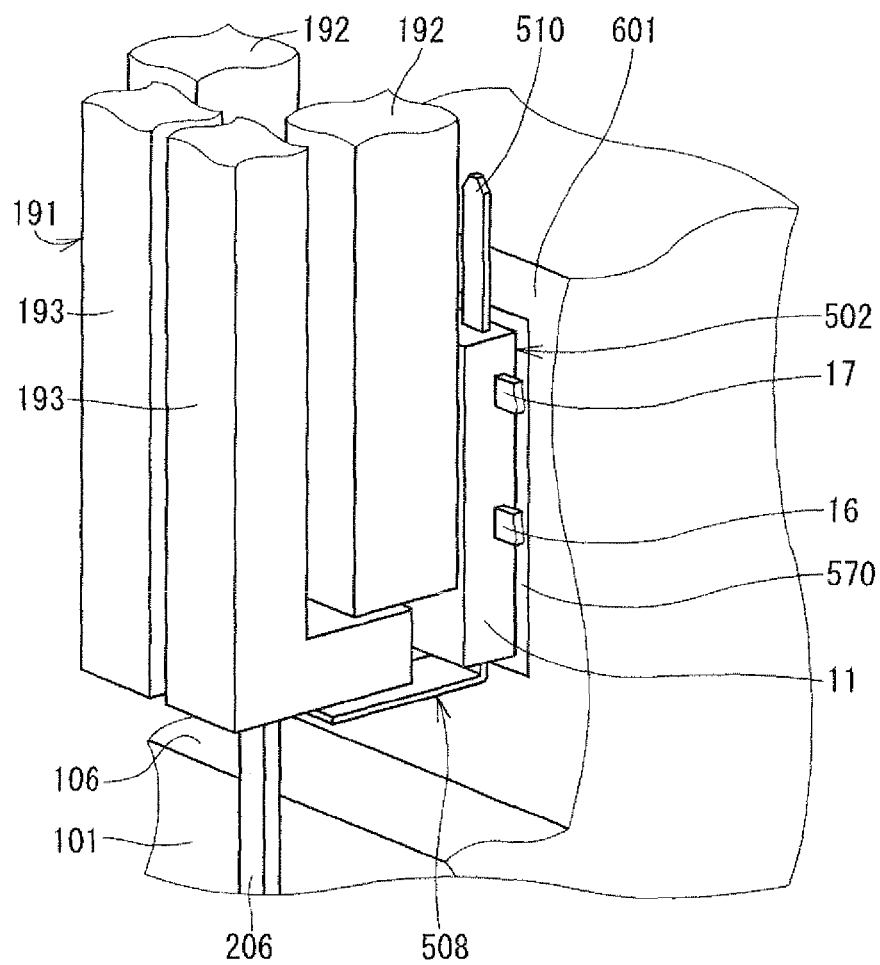
FIG. 11 is a perspective view showing a welding jig and the semiconductor module used in the first embodiment.
Figure 12:
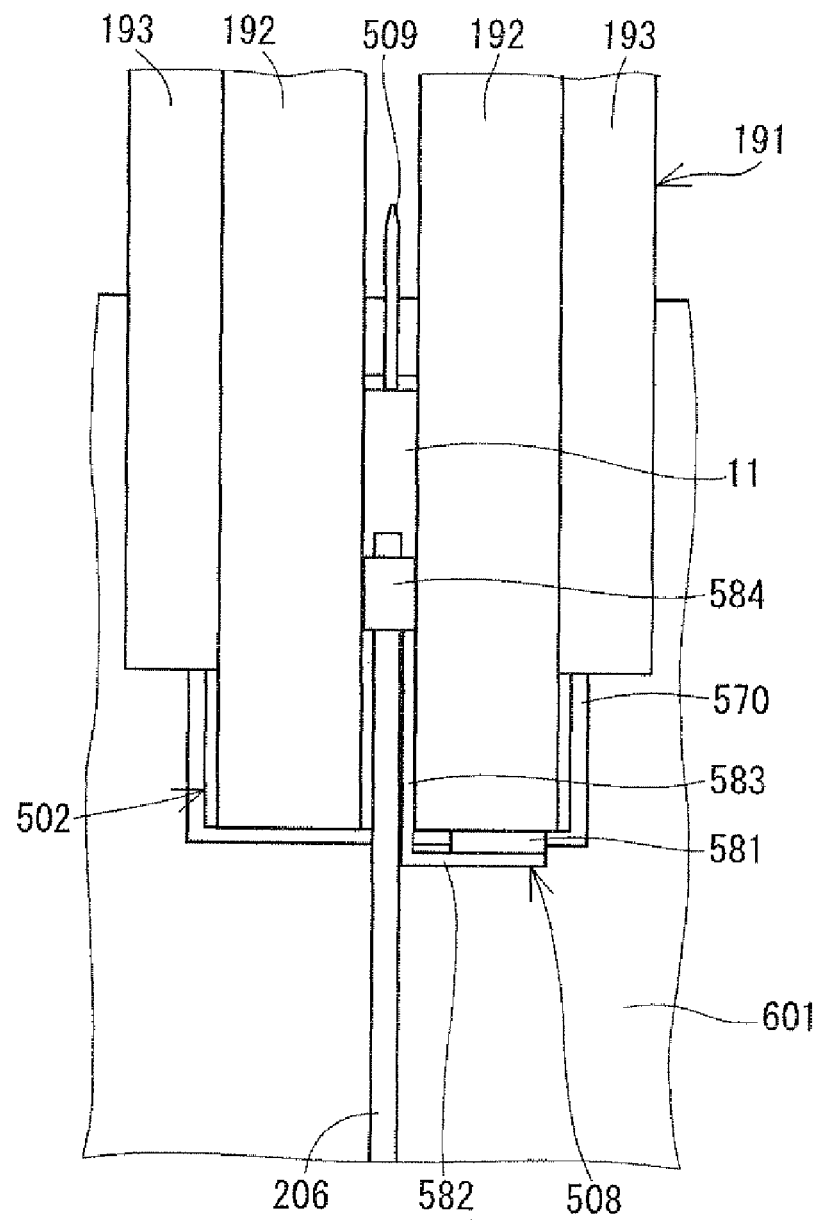
FIG. 12 is a front view showing a state of using the welding jig and the semiconductor module used in the first embodiment.

The coil terminal 508 and the lead wire of the coil 205 are connected by using a jig in the following manner. As shown in FIGS. 11 to 13, a jig 191 has a welding electrode 192 and a cooling metal member 193. The welding electrode 192 is formed of a metal having a large resistance and connected to a power source (not shown). The welding electrode 192 welds the connection part 583 and the lead wire 206, when electric power is supplied while sandwiching the connection part 584 of the coil terminal 508. The cooling metal member 193 is formed of a metal having a large heat capacity. The cooling metal member 193 dissipates heat, which is generated when the coil terminal 508 and the lead wire 206 are welded. Thus, the heat is restricted from being transferred to the resin part 11 at the time of welding. The region between the end part of the coil terminal 508 at the counter-motor case 101 side and the end part of the jig 191 at the motor case 101 side is referred to as a jig region S1 as shown in FIG. 13. The region, which is a combination of the jig region S1 and the coil-case gap region G1, is referred to as a welding region T1 as shown in FIG. 13. As understood from FIG. 13, the jig region S1 overlaps a resin part region R1, in which the resin part 11 is placed, in the axial direction of the motor case 101. That is, the welding region T1 overlaps the resin part R1.

Figure 34:
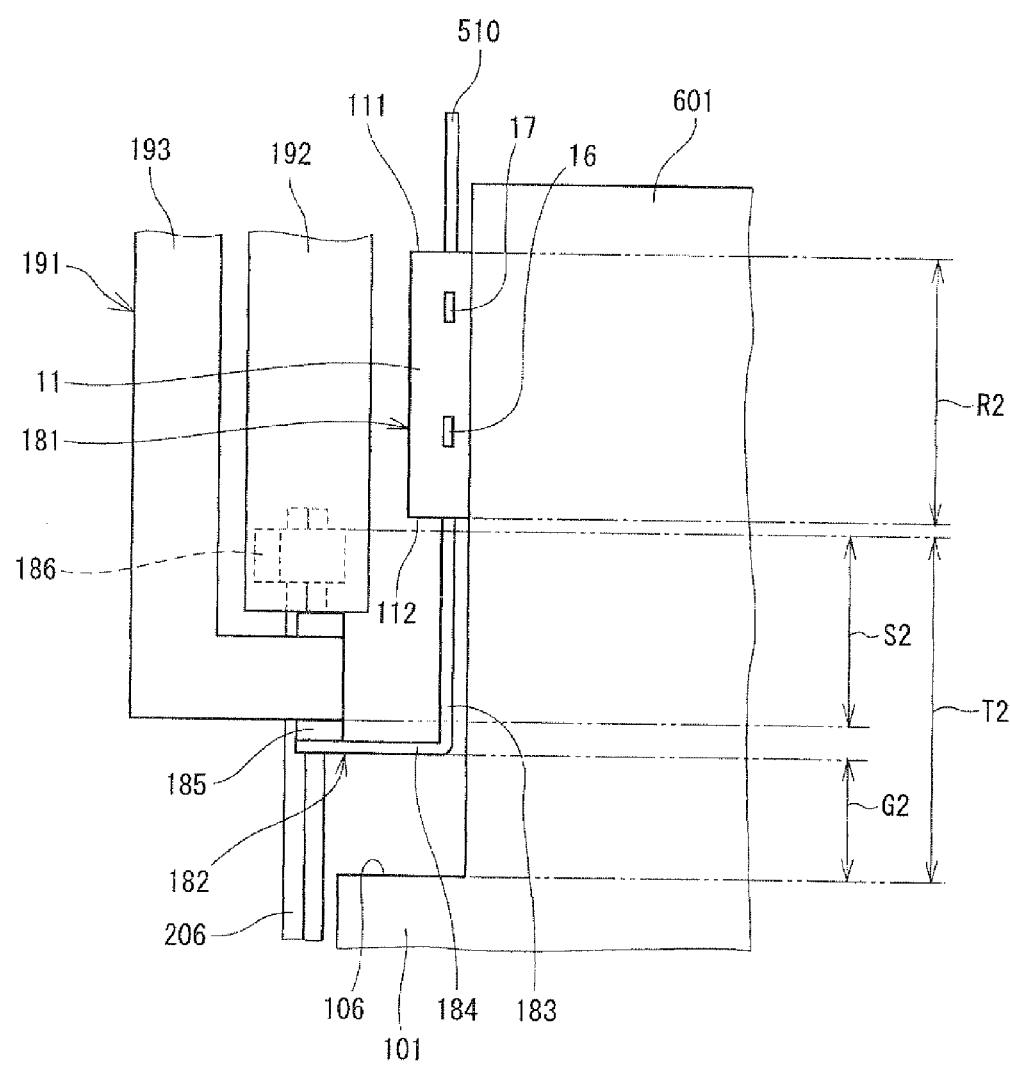
FIG. 34 is a schematic side view showing the welding jig and the semiconductor module in the comparative example.

An exemplary comparative semiconductor module 181 is shown in FIGS. 31 to 34. In FIGS. 31 to 34, a coil terminal 182 and the lead wire 206 of the coil 205 are connected. The coil terminal 182 of the semiconductor module 181 has a droop part 183, an intermediate part 184, a rise part 185 and a connection part 186. The droop part 183 of the coil terminal 182 is longer in the axial direction of the motor case 101 than the droop part 581 of the coil terminal 508 of the first embodiment. The connection part 186 of the coil terminal 182 is positioned closer to the motor case 101 than the bottom side wall surface 112 of the resin part 11 is in the axial direction of the motor case 101. That is, the connection part 186 is located between the bottom side wall surface 112 and the end wall 106. Thus, as shown in FIG. 34, the jig region S2 does not overlap the resin part region R2. That is, the welding region T2, which corresponds to the jig region S2 plus the terminal-case region G2, does not overlap the resin part region R2.

According to the first embodiment, as shown in FIG. 13, the jig region S1 and the resin part region R1 overlap each other and, further, the welding region T1 and the resin part region R1 overlap each other. As a result, in comparison to the exemplary case, the size of the electronic circuit-integrated motor device 1 can be reduced in the axial direction.

As described above, the semiconductor modules 501 to 506 have respective coil terminals 508, to which the lead wires 206 of the coils 205 are connectable directly. Therefore, the lead wires 206 of the coils 205 and the semiconductor modules 501 to 506 can be connected without using the printed circuit board 801.

As a result, the coil terminal 508 can be formed in a desired size without being restricted by the thickness of copper films of the printed circuit board 801. For example, the coil terminal 508 is formed thick and short and is connected to the end of the coil and the semiconductor module, and is placed closely to the semiconductor module. In this case, the impedance can be reduced and the reliability of the motor can be enhanced.

The connection part 584 of the coil terminal 508, which connects to the lead wire 206 of the coil 205 is located between the bottom side wall surface 112 of the resin part 11 at the motor case 101 side and the top side wall surface 111 of the resin part 11 at the counter-motor case 101 side. Specifically, the connection part 584 is located at a position, which is more distant from the end wall 106 of the motor case 101 than the bottom side wall surface 112 of the resin part 11 but closer to the end wall 106 of the motor case 101 than the top side wall surface 111 of the resin part 11 in the axial direction of the motor case 101. That is, the jig region S1, which is a space in the axial direction for placing the jig 191 in welding the coil terminal 508 and the coil 205, overlaps the resin part region R1. The size of the motor device 1 in the axial direction can thus be reduced. Since the connection part 584 is between the top side wall surface 111 and the bottom side wall surface 112, that is, the connection part 584 is provided closer to the end wall 106 of the motor case 101 than the top side wall surface 111 of the resin part 11 is, the axial lengths of the coil terminal 508 and the coil 205 can be shortened and hence the impedance can be reduced.

The coil terminal 508 is bent to form the connection part 584, which sandwiches the lead wire 206 of the coil 205. The coil terminal 508 and the coil 205 can thus be directly connected relatively easily. The coil terminal 508 protrudes from the bottom side wall surface 112 of the resin part 11 at the side facing the motor case 101. The coil terminal 508 has the droop part 581, the intermediate part 582 and the rise part 583. The droop part 581 protrudes from the bottom side wall surface 112, which faces the end wall 106 of the motor case 101. The intermediate part 582 extends from the droop part 581 and is bent in the direction of thickness of the resin part 11. The rise part 583 extends from the intermediate part 582 and is bent in the direction opposite to the end wall 106 of the motor case 101, that is, in the direction to be distanced more from the end wall 106. The connection part 584 is formed at the top end of the rise part 583. By designing the droop part 581, the intermediate part 582 and the rise part 583 to be in the appropriate size, the connection part 584 can be positioned easily between the top and bottom side wall surfaces 111 and 112, which face each other in the resin part 11.

Each of the semiconductor modules 501 to 503, which forms the linked semiconductor module unit 10, has the bus bars 16 and 17, which link to the other semiconductor modules. The bus bar 16 has the embedded part, which is embedded in the resin part 11, and the exposed part 161, which is exposed from the resin part 11. Similarly, the bus bar 17 has the embedded part, which is embedded in the resin part 11, and the exposed part 171, which is exposed from the resin part 11. The exposed parts 161 and 167 are formed integrally and contiguously with the embedded parts, which are embedded in the other semiconductor modules. The bus bars 16 and 17 link a plurality of, for example three, semiconductor modules to form the linked semiconductor module unit. As a result, assembling is simplified. The linked semiconductor module unit 20 has the same configuration and features as the linked semiconductor module unit 10.

Each of the semiconductor modules 501 to 509 has control terminals 509, which are connected to the printed circuit board 801 having the control circuit 70 for controlling the current supply to the coil 205. The coil terminal 508 and the control terminals 509 are provided on the different side wall surfaces of the resin part 11. Specifically, the coil terminal 508 and the control terminals 509 protrude in the opposite directions from the resin part 11. The control terminals 509 and the coil terminal 508 are formed in correspondence to the positions of the printed circuit board 801 and the coil 205. As a result, the printed circuit board 801 and the control terminals 509 can be connected each other readily, and the coil 205 and the coil terminal 508 can be connected each other readily.

The semiconductor modules 501 to 506 are located between the motor case 101 and the printed circuit board 801 in the axial direction of the shaft 401. The semiconductor modules 501 to 506 are arranged so that the coil terminal 508 is at the motor case 101 side and the control terminals 509 are at the printed circuit board 801 side. By this arrangement, the space adjacent to the motor case 101 can be utilized efficiently, and hence the size of the motor device 1 can be reduced. The heat sink 601 is provided to rise from the end wall 106 of the motor case 101, and each module 501 to 506 is arranged to have a planar contact to the heat sink 601 through the heat dissipating insulation sheet 570. Thus, the heat generated by the semiconductor modules 501 to 506 can be dissipated efficiently. By this arrangement, the space can be utilized efficiently and the size of the motor device 1 can be reduced. By arranging the semiconductor module to rise in the axial direction of the motor case 101, that is, in the longitudinal direction of the motor case 101, the space required in the radial direction for arranging the semiconductor modules 501 to 506 can be ensured.

Second Embodiment

In the second embodiment, a semiconductor module for an electronic circuit-integrated motor device is configured as shown in FIGS. 14 to 19. The electronic circuit-integrated motor device is configured in the similar manner as in the first embodiment.

Figure 17:
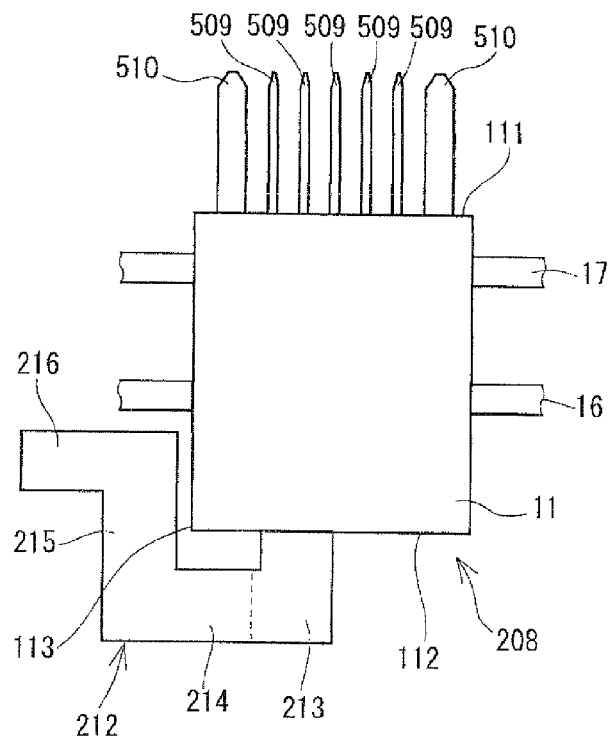
FIG. 17 is a front view showing a coil terminal of the semiconductor module before being bent to be used in the second embodiment.
Figure 18:
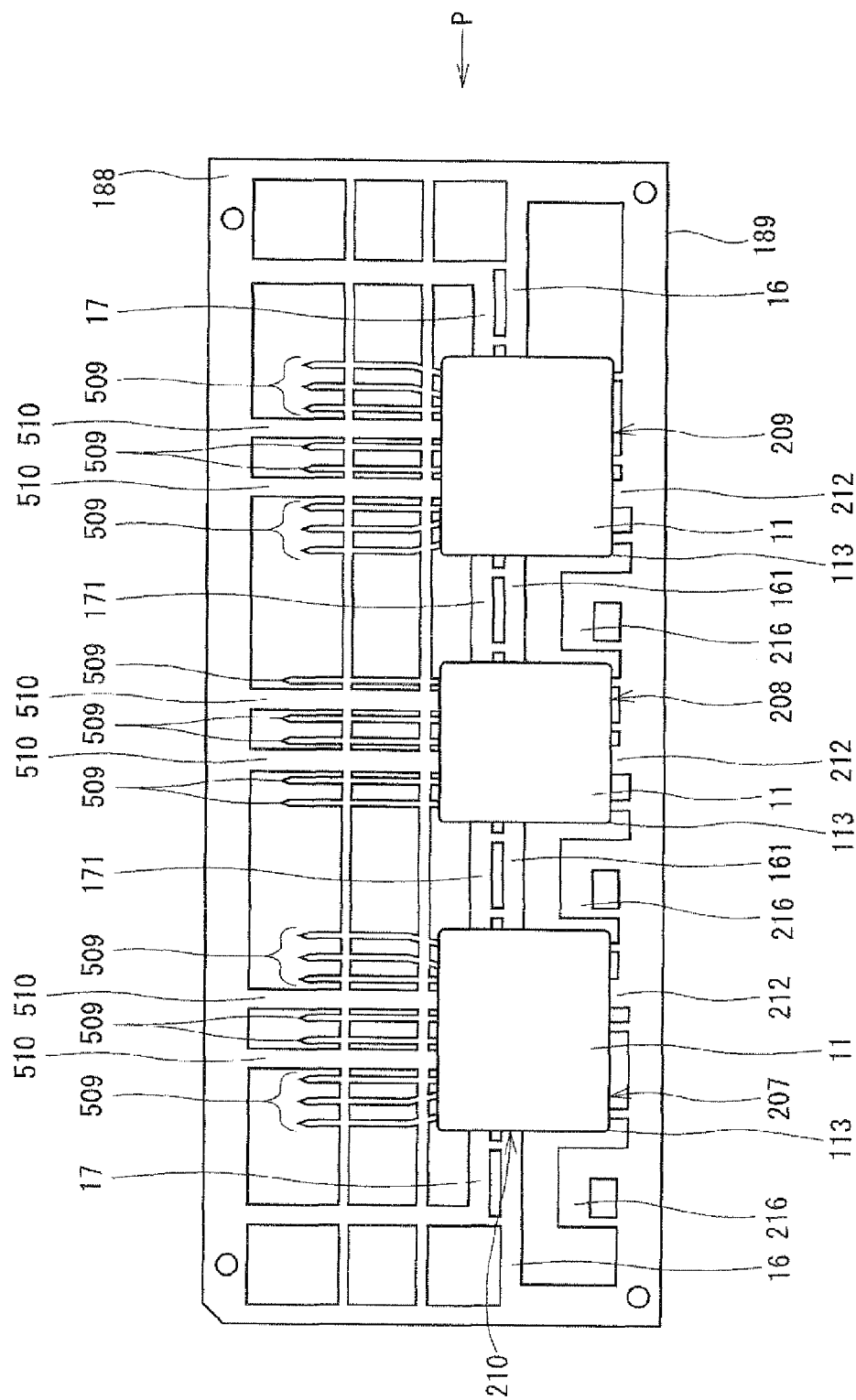
FIG. 18 is a plan view showing a lead frame of semiconductor modules in the course of manufacture of a linked semiconductor module unit used in the second embodiment.

As shown in FIG. 18, a linked semiconductor module unit 210 is formed of semiconductor modules 207, 208 and 209, which are linked by the first bus bar 16 and the second bus bar 17. Since the semiconductor modules 207 to 209 have substantially the same configurations, the semiconductor module 208 is described in detail with reference to FIGS. 14 to 17.

The semiconductor module 208 has a coil terminal 212, which protrudes from the bottom side wall surface 112 of the resin part 11 facing the end wall 106 of the motor case 101. The coil terminal 212 has a droop part 213, an intermediate part 214, a rise part 215 and a connection part 216. The droop part 213, the intermediate part 214, the rise part 215 and the connection part 216 are formed integrally as a single conductive member.

The droop part 213 is protruded from the bottom side wall surface 112 of the resin part 11, which faces the end wall 106 of the motor case 101, generally perpendicularly, in case the resin part 11 is assembled in the electronic circuit-integrated motor device 1. The intermediate part 214 is bent about 90 degrees in the direction of thickness of the resin part 11 from the droop part 581. The intermediate part 214 is thus bent perpendicularly to the direction of width of the resin part 11 such that it protrudes in the radially outward direction. The intermediate part 214 extends in parallel to the end wall 106 and in the direction opposite to the heat sink 601, in case it is arranged in the electronic circuit-integrated motor device 1.

The rise part 215 is formed to rise perpendicularly from the intermediate part 214 in a direction, which is opposite to the end wall 106 of the motor case 101. The intermediate part 214 and the rise part 215 are formed in an L-shape so that the coil terminal 212 is not bent between the intermediate part 214 and the rise part 215. The connection part 216 is formed at the top end of the rise part 215 and bent in a U-shape opening toward the heat sink 601 and the resin part 11. The connection part 216 is bent to clamp the lead wire 206 of the coil 205, which is taken out in the axial direction of the motor case 101 through the hole (not shown) formed in the end wall 106. The connection part 216 and the lead wire 206 are electrically connected by welding. Thus, the coil terminal 508 and the lead wire 206 of the coil 205 are directly connected.

In case that the semiconductor modules 501 to 506 are arranged within the motor device 1, the connection part 216 of the coil terminal 508 is positioned between the bottom side wall surface 112 of the resin part 11, which faces the end wall 106 of the motor case 101, and the top side wall surface 111 of the resin part 11, which faces the printed circuit board 801 and does not face the end wall 106. As a result, the same advantage is provided as in the first embodiment.

The linked semiconductor module device 210 is further shown in FIGS. 18 and 19, in which FIG. 18 shows the state before the electronic circuit-integrated motor device 210 is cut out from a lead frame 188. As shown in FIGS. 17 and 18, the coil terminal 212 is formed such that the part formed in the L-shape by the intermediate part 214 and the rise part 215 is formed to surround one corner part 113 of the bottom side wall surface 112 before being bent, that is, before being assembled in the motor device 1. The connection part 216 formed at the top end of the rise part 215 is formed at a position, which is between the two resin parts 11 (for example, modules 207 and 208), which are linked each other by the bus bars 16 and 17. A lower end part 189 of the lead frame 188 provides the droop part 213 and the intermediate part 214. The connection part 216 is formed between the lower end part 189 and the first bus bar 16 of the lead frame 188.

Figure 35:
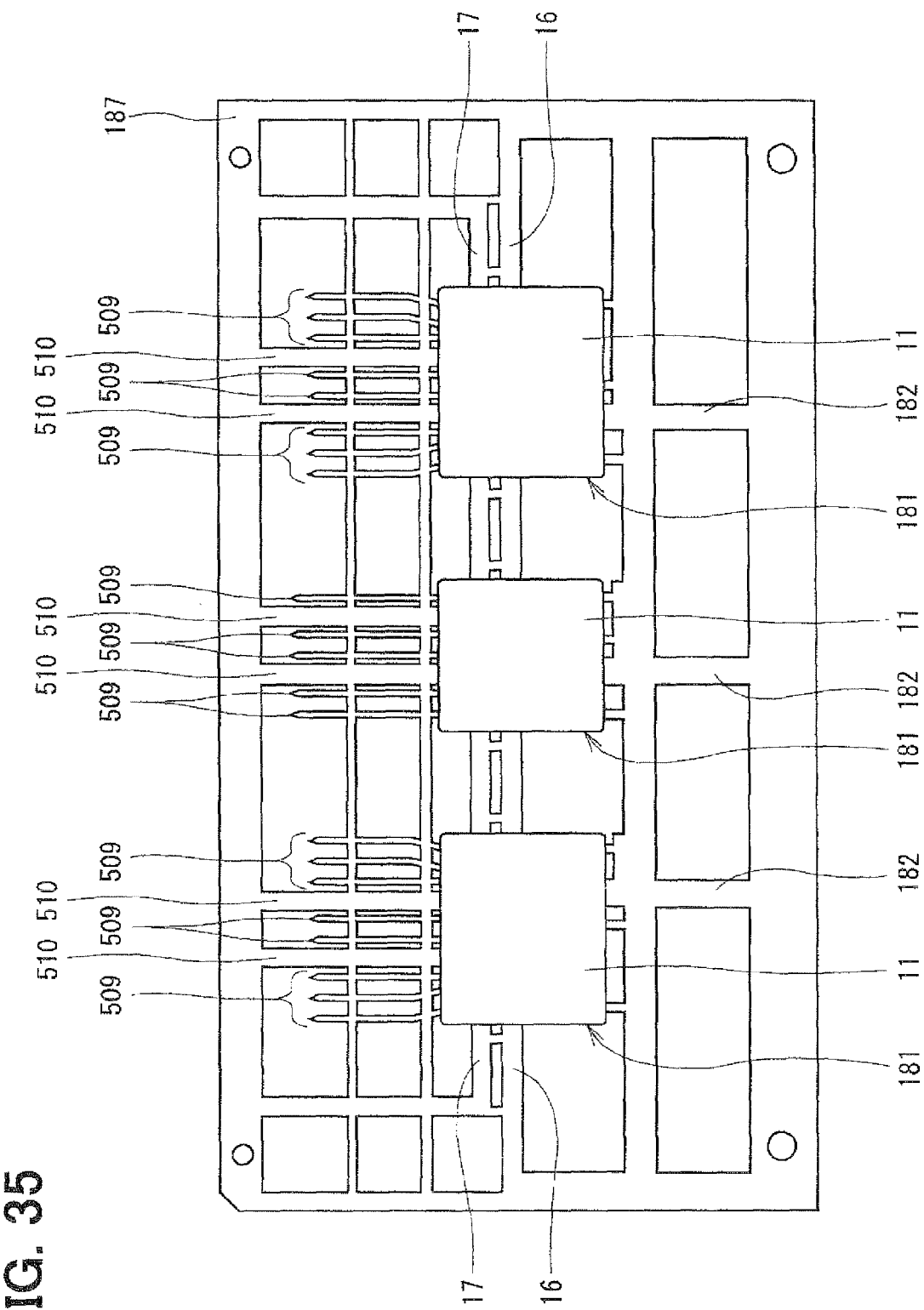
FIG. 35 is a plan view of a lead frame including semiconductor modules in the comparative example in the course of manufacturing a linked semiconductor module unit according to the comparative example.

A semiconductor module unit 180, which is before being cut out from a lead frame 187, is shown in FIG. 35 as one comparative example relative to the linked semiconductor module unit used in the second embodiment shown in FIG. 18.

A coil terminal 182 of the semiconductor module unit 180 protrudes considerably in the downward direction from the resin part 11 before being bent. Therefore, the area of the lead frame 187 is large. Since the connection part 216 is formed sidewise the resin part 11 in the lead frame 188 shown in FIG. 18, the lead frame 188 can be used more efficiently than in the comparative example shown in FIG. 35. Thus, the size of the lead frame can be reduced.

The lead frame 188 is formed thick partly to provide a heat dissipation part 569 as shown in FIG. 19. The heat dissipation part 569 is not embedded in the resin part 11 but is exposed from the resin part 11. This heat dissipating part 569 is arranged to make a planar contact with the side wall of the heat sink 601 via the heat dissipating insulation sheet 570. As a result, the heat generated by the semiconductor module 208 can be dissipated efficiently. The thickened part of the lead frame 188 is formed to extend continuously in the direction, in which the bus bars 16 and 17 extend. The connection part 216 is formed in the thickened part. Thus, the connection part 216 is thicker than other parts. Even if the coil 205 is thick relative to the thickness of the coil terminal 508, the coil terminal 508 and the coil 205 can be surely connected without thickening the lead frame over its entire area, because at least the connection part 216 is thickened.

Third Embodiment

Figure 20A:
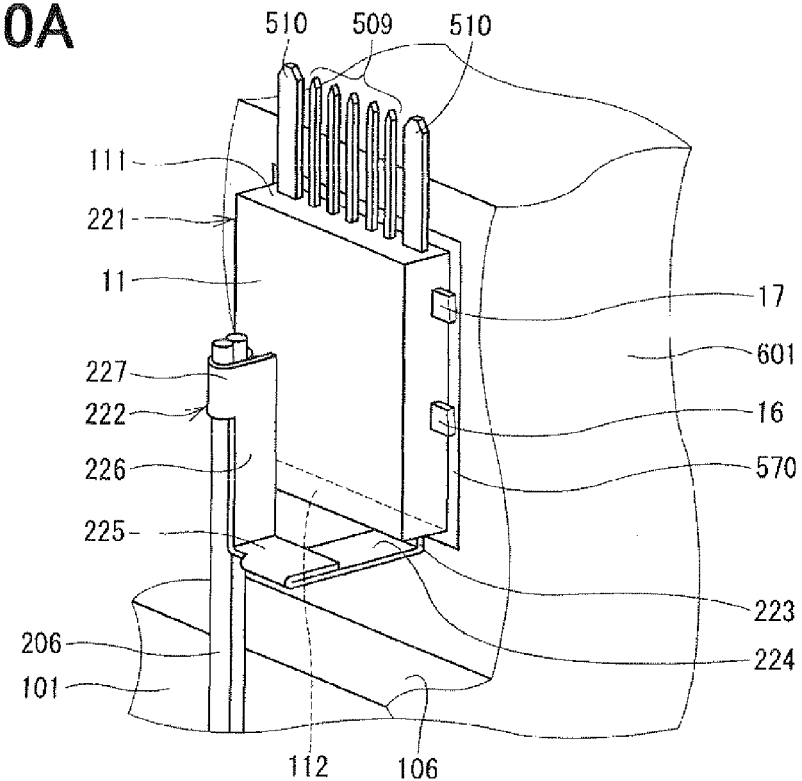
FIG. 20A is a perspective view showing a semiconductor module used in an electronic circuit-integrated motor device according to the third embodiment of the present invention.
Figure 20B:
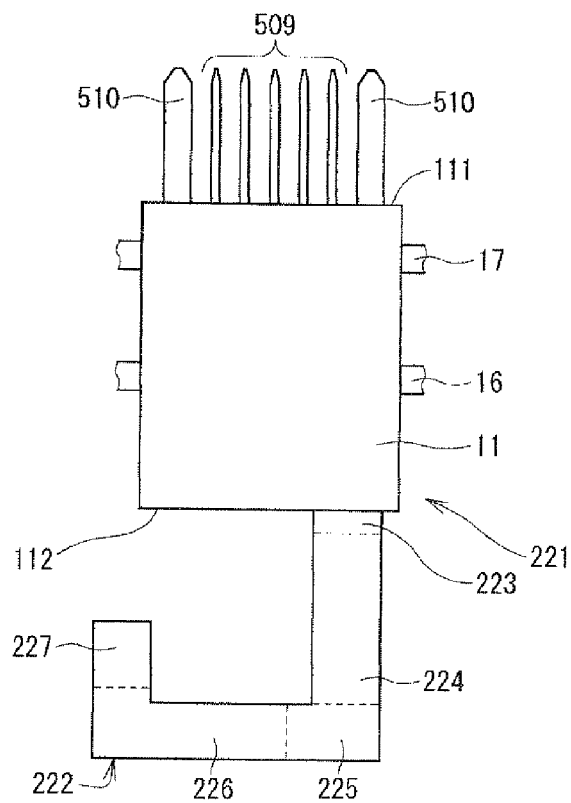
FIG. 20B is a front view showing a coil terminal of the semiconductor module before being bent to be used in the third embodiment.

In the third embodiment, a semiconductor module for an electronic circuit-integrated motor device is configured as shown in FIGS. 20A and 20B as a modification of the first embodiment.

A coil terminal 222 of a semiconductor module 221 is protruded from the bottom side wall surface 112 of the resin part 11, which faces the end wall 106 of the motor case 101. The coil terminal 222 has a droop part 223, an intermediate part 224, a turned part 225, a rise part 226 and a connection part 227. The droop part 223, the intermediate part 224, the turned part 225, the rise part 226 and the connection part 227 are formed integrally as a single conductive member.

The droop part 213 is protruded from the bottom side wall surface 112 of the resin part 11, which faces the end wall 106 of the motor case 101, generally perpendicularly, in case the resin part 11 is assembled in the electronic circuit-integrated motor device 1. The droop part 223 is formed smaller than the intermediate part 224 and the rise part 226. Specifically, the coil terminal 222 is bent in the radially outward direction (direction of thickness of the resin part 11), that is, in the direction leaving the heat sink 601, to extend in parallel to the bottom side wall surface 112 facing the end wall 106. The intermediate part 582 is bent at a position as near as possible to the resin part 11 in the axial direction with a certain gap from the bottom side wall surface 112 not to damage the resin part 11. The droop part 223 is located at a position deviated toward the bottom right corner from the width center of the resin part 11.

The intermediate part ss4 formed by bending from the droop part 223 is turned about 180 degrees at its top end in the direction to the resin part 11 to provide the turned part 225. The rise part 226 extending from the turned part 225 is formed perpendicularly to the intermediate part 224. The rise part 226 is formed by bending about 90 degrees from the turned part 225 in the direction toward the printed circuit board 801, that is, in the direction leaving away more from the end wall 106. The droop part 223 and the rise part 226 extend in parallel but are positioned at different locations, which are deviated from each other in the directions of width (left and right) and thickness of the resin part 11.

The connection part 227 is formed at the top end of the rise part 226 and bent in a U-shape opening toward the heat sink 601 and the resin part 11. The connection part 227 is bent to clamp the lead wire 206 of the coil 205. The connection part 227 is welded to the lead wire 206. Thus, the coil terminal 222 and the lead wire 206 of the coil 205 are directly connected.

In case that the semiconductor module 221 is arranged within the motor device 1, the connection part 227 of coil terminal 222 is positioned between the bottom side wall surface 112 of the resin part 11, which faces the end wall 106 of the motor case 101, and the top side wall surface 111 of the resin part 11, which faces the printed circuit board 801 and is opposite to the end wall 106.

As a result, the same advantage is provided as in the first embodiment.

In the state before the coil terminal 222 is bent, the connection part 227 is formed to extend from the rise part 226 in the direction (downward in FIG. 20B), which is opposite to the direction of protrusion of the coil terminal 222 from the bottom side wall surface 112 of the resin part 11. As a result, although the coil terminal 222 is bent at more positions than in the first embodiment, the similar assemblability can be maintained as in the first and the second embodiments. The lead frame can be reduced in size than in the first embodiment.

Fourth Embodiment

Figure 21A:
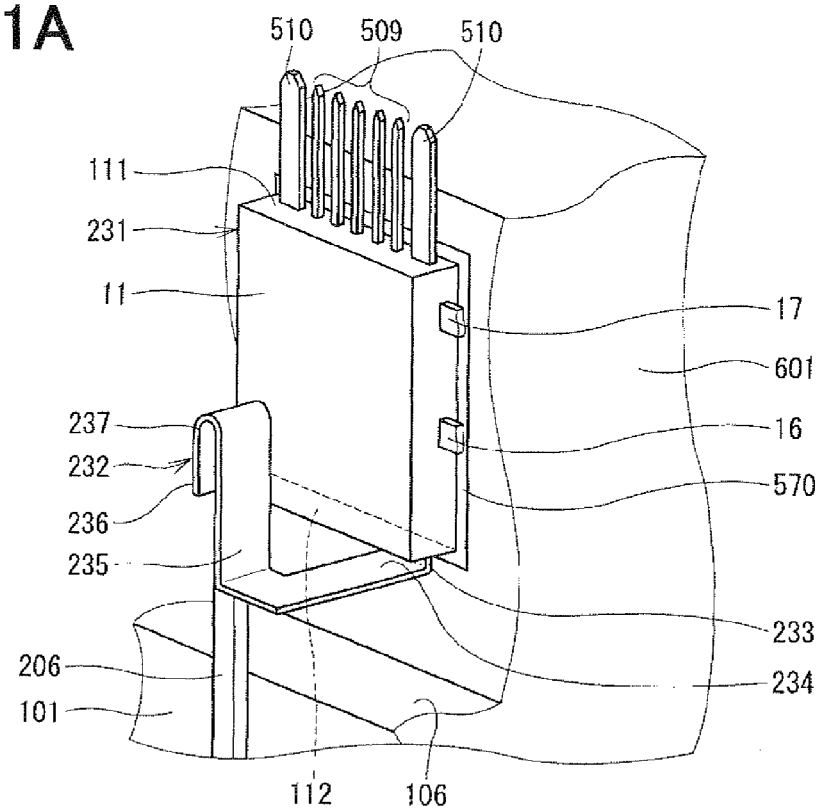
FIG. 21A is a perspective view showing a semiconductor module used in an electronic circuit-integrated motor device according to the fourth embodiment of the present invention.
Figure 21B:
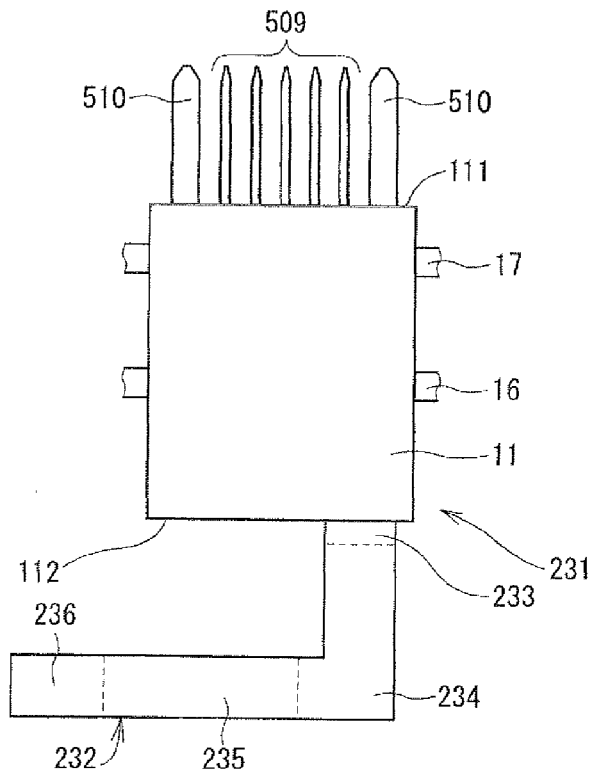
FIG. 21B is a front view showing a coil terminal of the semiconductor module before being bent to be used in the fourth embodiment.

In the fourth embodiment, a semiconductor module for an electronic circuit-integrated motor device is configured as shown in FIGS. 21A and 21B. A coil terminal 232 of a semiconductor module 231 is protruded from the bottom side wall surface 112 of the resin part 11, which faces the end wall 106 of the motor case 101. The coil terminal 232 has a droop part 233, an intermediate part 234, a rise part 235 and a top end part 236. The droop part 233, the intermediate part 234, the rise part 235 and the top end part 236 are formed integrally as a single conductive member.

The droop part 233 is protruded from the bottom side wall surface 112 of the resin part 11, which faces the end wall 106 of the motor case 101, generally perpendicularly, in case the resin part 11 is assembled in the electronic circuit-integrated motor device 1. The droop part 233 is formed smaller than the intermediate part 234, the rise part 235 and the like. Specifically, the coil terminal 232 is bent in the radially outward direction (direction of thickness of the resin part 11), that is, in the direction leaving the heat sink 601, to extend in parallel to the bottom side wall surface 112 facing the end wall 106. The intermediate part 582 is bent at a position as near as possible to the resin part 11 with a certain gap from the bottom side wall surface 112 not to damage the resin part 11. The droop part 223 is located at a position deviated from the width center of the resin part 11.

The intermediate part 234 formed by bending from the droop part 233 is formed in an L-shape, which extends in the circumferential direction from the radially outside part in case that the semiconductor module 11 is arranged in the electronic circuit-integrated motor device 1. The intermediate part 234 is in parallel to the end wall 106 of the motor case 101. The rise part 235 is formed by bending about 90 degrees from the top end side of the intermediate part 234 extending in the circumferential direction in the direction toward the printed circuit board 801, that is, in the direction leaving away more from the end wall 106. The droop part 233 and the rise part 235 extend in the same direction but are positioned at different locations, which are deviated from each other in the direction of width (left and right) and thickness of the resin part 11.

The top end part 236 is turned to open in the direction toward the end wall 106 of the motor case 101 such that it covers the end part of the coil 205 from the counter-motor case 101 side. The top end part 236 is thus turned about 180 degrees from the rise part 235 to clamp the lead wire 206 of the coil 205 between the rise part 235 and the top end part 236, that is, in a U-shaped part formed by the rise part 235 and the top end part 236. The coil terminal 232 and the lead wire 206 of the coil 205 are directly connected. The top end part 236 and a part of the rise part 235 thus form a connection part 237. In case that the semiconductor module 231 is arranged within the motor device 1, the connection part 237 of the coil terminal 232 is positioned between the bottom side wall surface 112 of the resin part 11, which faces the end wall 106 of the motor case 101, and the top side wall surface 111 of the resin part 11, which faces the printed circuit board 801 and is opposite to the end wall 106. As a result, the same advantage is provided as in the first embodiment.

In the state before the coil terminal 232 is bent, the coil terminal 237 is formed in the L-shape as shown in FIG. 21B. Specifically, the rise part 235 and the top end part 236 of the coil terminal 232 are formed to extend linearly from the end of the intermediate part 234 in the direction (left-right direction in FIG. 21B), which is parallel to the bus bars 16 and 17. Therefore, the top end part 236 does not protrude perpendicularly to the bus bars 16 and 17 (downward direction in FIG. 21B). As a result, the lead frame can be reduced in size than in the first embodiment.

Fifth Embodiment

Figure 22A:
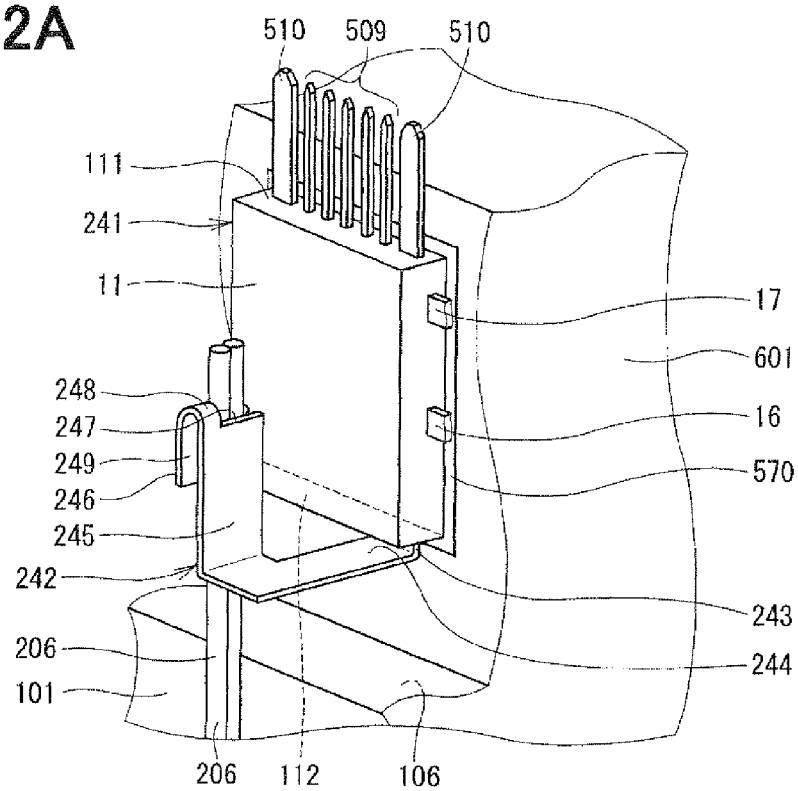
FIG. 22A is a perspective view showing a semiconductor module used in an electronic circuit-integrated motor device according to the fifth embodiment of the present invention.
Figure 22B:
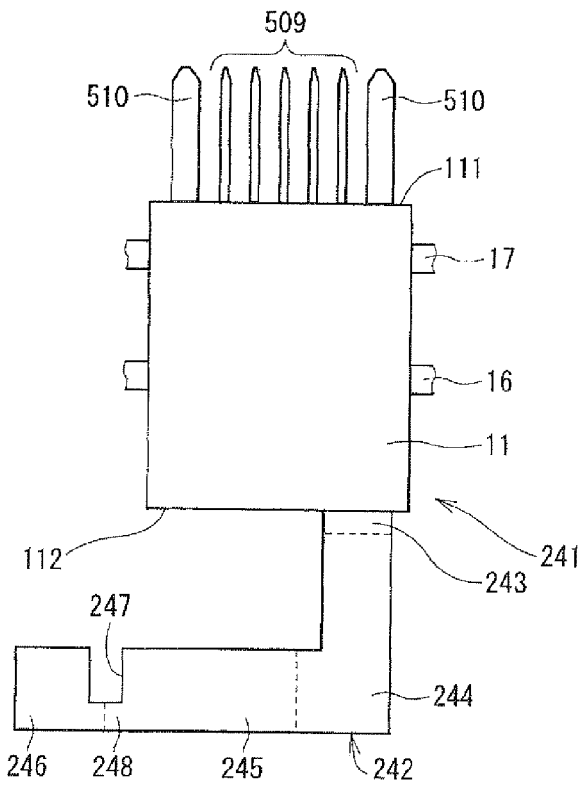
FIG. 22B is a front view showing a coil terminal of the semiconductor module before being bent to be used in the fifth embodiment.

In the fifth embodiment, a semiconductor module for an electronic circuit-integrated motor device according to the fifth embodiment is shown in FIGS. 22A and 22B as a modification of the fourth embodiment.

A coil terminal 242 of a semiconductor module 241 is protruded from the bottom side wall surface 112 of the resin part 11, which faces the end wall 106 of the motor case 101. The coil terminal 242 has a droop part 243, an intermediate part 244, a rise part 245 and a top end part 246. The droop part 243, the intermediate part 244, the rise part 245 and the top end part 246 are formed integrally as a single conductive member.

The droop part 243 is protruded from the bottom side wall surface 112 of the resin part 11, which faces the end wall 106 of the motor case 101, generally perpendicularly, in case the resin part 11 is assembled in the electronic circuit-integrated motor device 1. The droop part 243 is formed smaller than the intermediate part 244, the rise part 245 and the like. Specifically, the coil terminal 242 is bent in the radially outward direction (direction of thickness of the resin part 11), that is, in the direction leaving the heat sink 601, to extend in parallel to the bottom side wall surface 112 facing the end wall 106. The intermediate part 244 is bent at a position as near as possible to the resin part 11 with a certain gap from the bottom side wall surface 112 not to damage the resin part 11. The droop part 243 is located at a position deviated from the width center of the resin part 11, that is, located near a bottom right corner of the resin part 11.

The intermediate part 244 formed by bending from the droop part 243 is formed in an L-shape, which extends in the circumferential direction from the radially outside part in case that the semiconductor module 11 is arranged in the electronic circuit-integrated motor device 1. The intermediate part 234 is in parallel to the end wall 106 of the motor case 101. The rise part 245 is formed by bending about 90 degrees from the top end side of the intermediate part 244 extending in the circumferential direction in the direction toward the printed circuit board 801, that is, in the direction leaving away more from the end wall 106. The droop part 243 and the rise part 245 extend in the same direction but are positioned at different locations, which are deviated from each other in the direction of width (left and right) and thickness of the resin part 11.

A cut part 247 is formed between the rise part 245 and the top end part 246 as shown in FIG. 22B. To form the cut part 247, the end part of the intermediate part 244, which is opposite to the droop part 243, the rise part 245 and the top end part 246 are formed linearly and wider than in the fourth embodiment. The lead wire 206 of the coil 205 is inserted in the cut part 247 and the top end part 246 is turned downward as shown in FIG. 22A at a bottom part 248 of the cut part 247 shown in FIG. 22B.

The top end part 246 is turned to open in the direction toward the end wall 106 of the motor case 101. The top end part 246 is thus turned about 180 degrees from the rise part 245 at the bottom part 248 to clamp the lead wire 206 of the coil 205 between the rise part 245 and the top end part 246, that is, in a U-shaped part formed by the rise part 245 and the top end part 246. The coil terminal 242 and the lead wire 206 of the coil 205 are directly connected by welding. A top end part of the rise part 245, the cut part 247, the bottom part 248 and the top end part 246 thus form a connection part 249. In case that the semiconductor module 241 is arranged within the motor device 1, the connection part 249 of the coil terminal 242 is positioned between the bottom side wall surface 112 of the resin part 11, which faces the end wall 106 of the motor case 101, and the top side wall surface 111 of the resin part 11, which faces the printed circuit board 801 and is opposite to the end wall 106. As a result, the same advantage is provided as in the first embodiment.

In the state before the coil terminal 242 is bent, the coil terminal 242 is formed in the L-shape as shown in FIG. 22B. Specifically, the rise part 245 and the top end part 246 of the coil terminal 242 are formed to extend linearly from the end of the intermediate part 244 in the direction (left-right direction in FIG. 22B), which is parallel to the bus bars 16 and 17. Therefore, the top end part 246 does not protrude perpendicularly to the bus bars 16 and 17 (downward direction in FIG. 22B). As a result, the lead frame can be reduced in size than in the first embodiment. Further, the cut part 247 can determine the position of the lead wire 206.

Sixth Embodiment

Figure 23A:
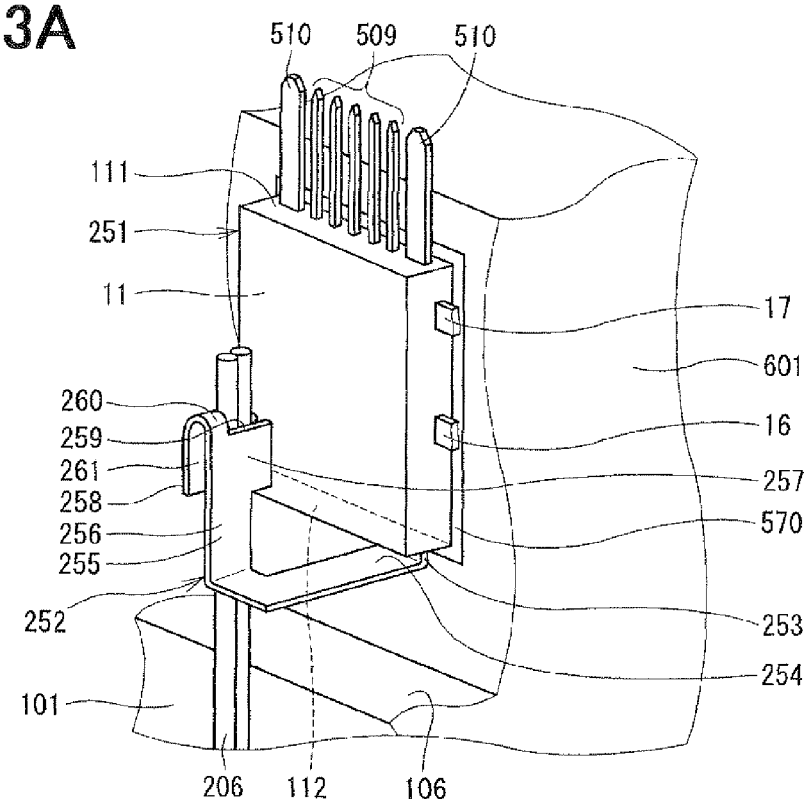
FIG. 23A is a plan view showing a semiconductor module used in an electronic circuit-integrated motor device according to the sixth embodiment of the present invention.
Figure 23B:
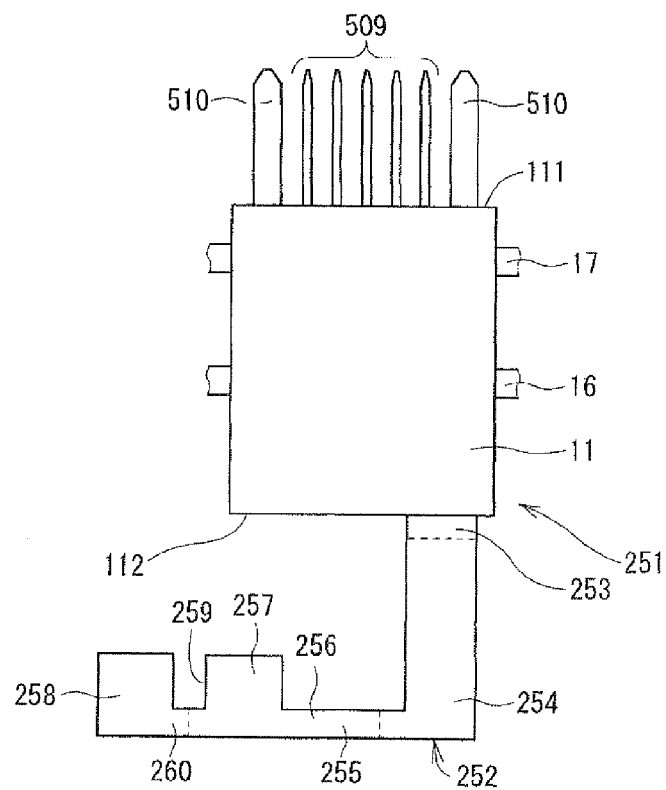
FIG. 23B is a front view showing a coil terminal of the semiconductor module before being bent to be used in the sixth embodiment.

In the sixth embodiment, a semiconductor module for an electronic circuit-integrated motor device is configured as shown in FIGS. 23A and 23B.

A coil terminal 252 of a semiconductor module 251 is protruded from the bottom side wall surface 112 of the resin part 11, which faces the end wall 106 of the motor case 101. The coil terminal 252 has a droop part 253, an intermediate part 254, a rise part 255 and a top end part 258. The droop part 253, the intermediate part 254, the rise part 255 and the top end part 258 are formed integrally as a single conductive member.

The droop part 253 is protruded from the bottom side wall surface 112 of the resin part 11, which faces the end wall 106 of the motor case 101, generally perpendicularly, in case the resin part 11 is assembled in the electronic circuit-integrated motor device 1. The droop part 253 is formed smaller than the intermediate part 254, the rise part 255 and the like. Specifically, the coil terminal 252 is bent in the radially outward direction (direction of thickness of the resin part 11), that is, in the direction leaving the heat sink 601, to extend in parallel to the bottom side wall surface 112 facing the end wall 106. The intermediate part 244 is bent at a position as near as possible to the resin part 11 with a certain gap from the bottom side wall surface 112 not to damage the resin part 11. The droop part 253 is provided at a position deviated toward the corner part from the width center of the resin part 11.

The intermediate part 254 formed by bending from the droop part 253 is formed in an L-shape, which extends in the radially outward direction in case that the semiconductor module 251 is arranged in the electronic circuit-integrated motor device 1. The intermediate part 254 is in parallel to the end wall 106 of the motor case 101.

The rise part 255 is formed by bending about 90 degrees from the top end side of the intermediate part 254. The droop part 253 and the rise part 255 extend in the same direction but are positioned at different locations, which are deviated from each other in the direction of width (left and right) and thickness of the resin part 11. The rise part 255 has a narrow part 256 and a wide part 257. The narrow part 256 extends from the top end part of the intermediate part 254, which is opposite to the droop part 253, and is narrower in width than the intermediate part 254. The wide part 257 extends from the top end part of the narrow part 256 and is wider than the narrow part 256. The top end part 258 has the same width as the wide part 257.

A cut part 259 is formed between the wide part 257 of the rise part 255 and the top end part 258 as shown in FIG. 23B. The lead wire 206 of the coil 205 is inserted in the cut part 259 and the top end part 258 is turned downward as shown in FIG. 23A at a bottom part 260 of the cut part 259 shown in FIG. 23B. The top end part 258 is turned to open in the direction toward the end wall 106 of the motor case 101. The top end part 258 is thus turned about 180 degrees at the bottom part 260 to clamp the lead wire 206 of the coil 205 between the wide part 257 and the top end part 258, that is, in a U-shaped part formed by the rise part 255 and the top end part 258. The coil terminal 252 and the lead wire 206 of the coil 205 are directly connected by welding. The wide part 257 of the rise part 255, the cut part 259, the bottom part 260 and the top end part 258 thus form a connection part 261.

In case that the semiconductor module 251 is arranged within the motor device 1, the connection part 261 of the coil terminal 252 is positioned between the bottom side wall surface 112 of the resin part 11, which faces the end wall 106 of the motor case 101, and the top side wall surface 111 of the resin part 11, which faces the printed circuit board 801 and is opposite to the end wall 106. As a result, the same advantage is provided as in the first embodiment. In the state before the coil terminal 252 is bent, the coil terminal 252 is formed in the L-shape or key shape as shown in FIG. 23B. Specifically, the rise part 255 and the top end part 258 of the coil terminal 252 are formed to extend linearly from the end of the intermediate part 254 in the direction (left-right direction in FIG. 23B), which is parallel to the bus bars 16 and 17. Therefore, the top end part 258 does not protrude perpendicularly to the bus bars 16 and 17 (downward direction in FIG. 23B). As a result, the lead frame can be reduced in size than in the first embodiment. As the cut part 259 is formed between the wide part 257 of the rise part 255 and the top end part 258, the position of the lead wire 206 can be determined readily by the cut part 259 as in the fifth embodiment.

Further, the rise part 255 is formed wide only at the wide part 257, which forms the connection part 261. That is, the rise part 255 is generally formed narrower than the wide part 257 as the narrow part 256 except the connection part 261. The heat capacity of the coil terminal 252 is thus reduced. As a result, the heat generated when the connection part 261 and the lead wire 206 are welded can be restricted from being transferred to the resin part 11.

Seventh Embodiment

Figure 24:
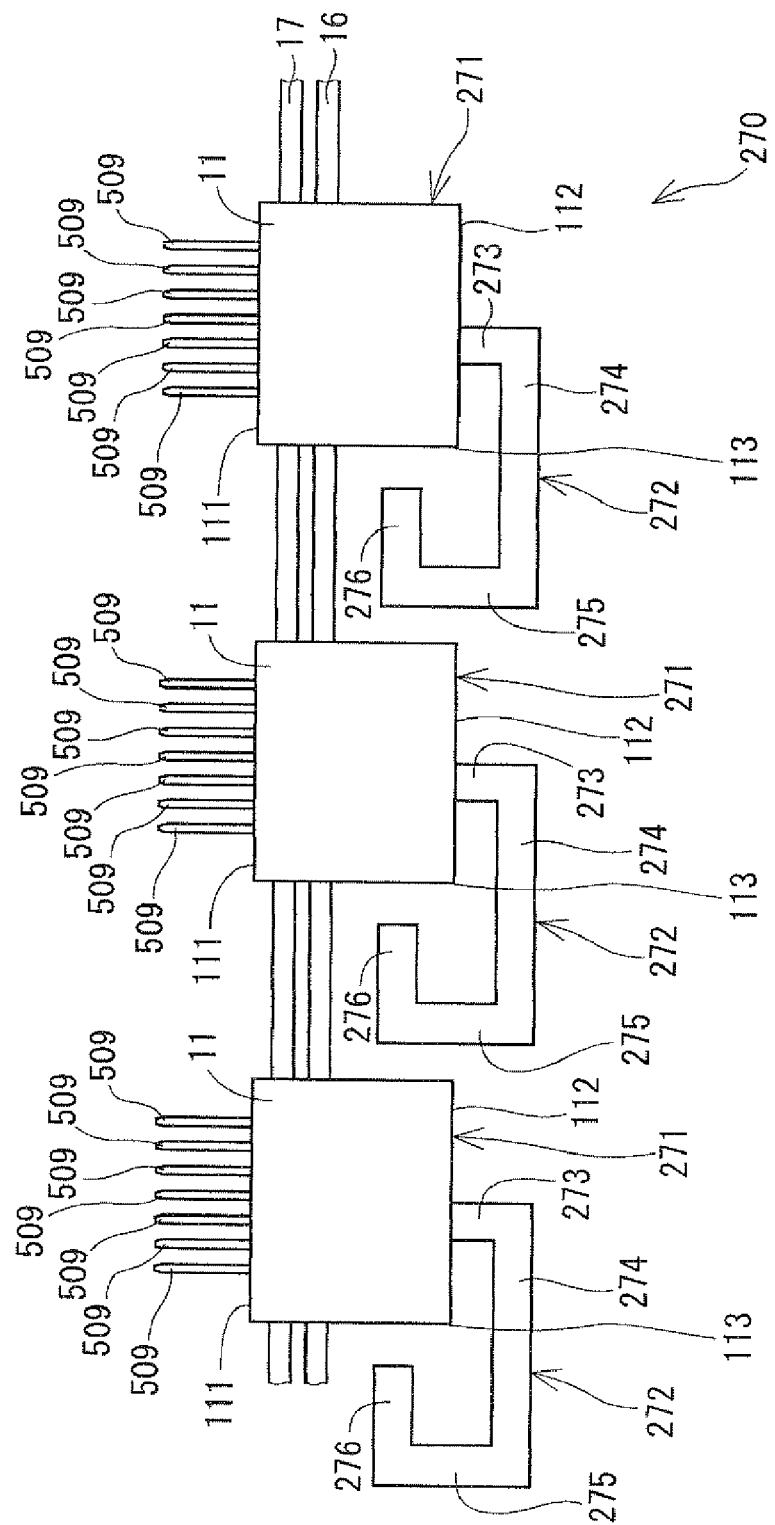
FIG. 24 is a front view showing a coil terminal of a linked semiconductor module unit before being bent to be used in the seventh embodiment.

In the seventh embodiment, a semiconductor module for an electronic circuit-integrated motor device is configured as shown in FIGS. 24, 25, 26A and 26B. In FIG. 24, the capacitor terminals are not shown.

A coil terminal 272 of a semiconductor module 271 of a linked semiconductor module unit 270 is protruded from the bottom side wall surface 112 of the resin part 11, which faces the end wall 106 of the motor case 101. The coil terminal 272 has a droop part 273, an intermediate part 274, a rise part 275 and a connection part 276. The droop part 273, the intermediate part 274, the rise part 275 and the connection part 276 are formed integrally as a single conductive member.

The droop part 273 is protruded from the bottom side wall surface 112 of the resin part 11, which faces the end wall 106 of the motor case 101, generally perpendicularly, in case the resin part 11 is assembled in the electronic circuit-integrated motor device 1. Specifically, the intermediate part 274 is bent about 90 degrees from the droop part 273 in the radially outward direction (direction of thickness of the resin part 11), that is, in the direction leaving the heat sink 601, to extend in parallel to the bottom side wall surface 112 facing the end wall 106. The intermediate part 274 is formed to extend in the direction opposite to the heat sink 601, in case it is arranged in the electronic circuit-integrated motor device 1.

Figure 26A:
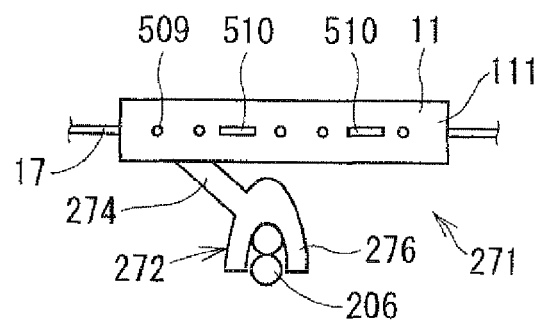
FIG. 26A is a plan view showing connection of the semiconductor module and a coil in the seventh embodiment.
Figure 26B:
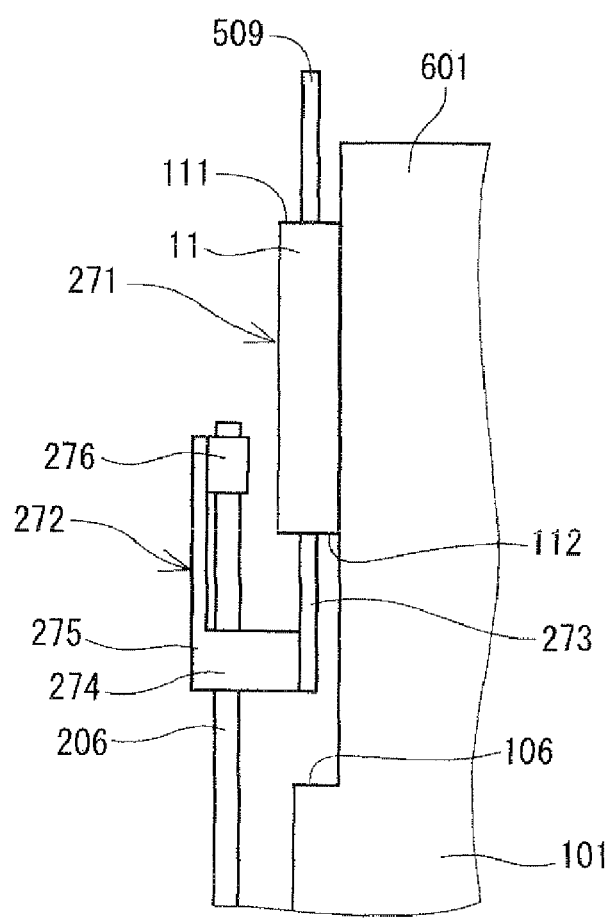
FIG. 26B is a side view showing the semiconductor module used in the seventh embodiment.

The rise part 275 is formed to rise from the intermediate part 271 at an angle of about 90 degrees in the direction opposite to the end wall 106 of the motor case 101. The rise part 275 and the intermediate part 274 are formed in an L-shape as in the second embodiment. The rise part 275 and the intermediate part 274 are not bent therebetween. The connection part 276 is formed at the top end of the rise part 275 in an L-shape and bent in a U-shape to open in the direction opposite to the heat sink 601 as shown in FIG. 26A. The connection part 276 clamps the lead wire 206 of the coil 205 and is welded to the lead wire 206. The coil terminal 271 and the lead wire 206 of the coil 205 are thus directly connected.

In case that the linked semiconductor module unit 270 is arranged within the motor device 1, the connection part 276 of the coil terminal 272 is positioned between the bottom side wall surface 112 of the resin part 11, which faces the end wall 106 of the motor case 101, and the top side wall surface 111 of the resin part 11, which faces the printed circuit board 801 and is opposite to the end wall 106. As a result, the same advantage is provided as in the first embodiment.

In the state before the coil terminal 272 is bent, the coil terminal 252 is formed in the L-shape between the intermediate part 274 and the rise part 275 so that this L-shape part surrounds one end part or corner part 113 of the bottom side wall surface 112 of the resin part 11. The connection part 276 formed at the top end of the rise part 275 is provided at the side of the resin part 11, that is, between two resin parts adjacent to each other. The lead frame can be used efficiently and reduced in size.

Figure 25:
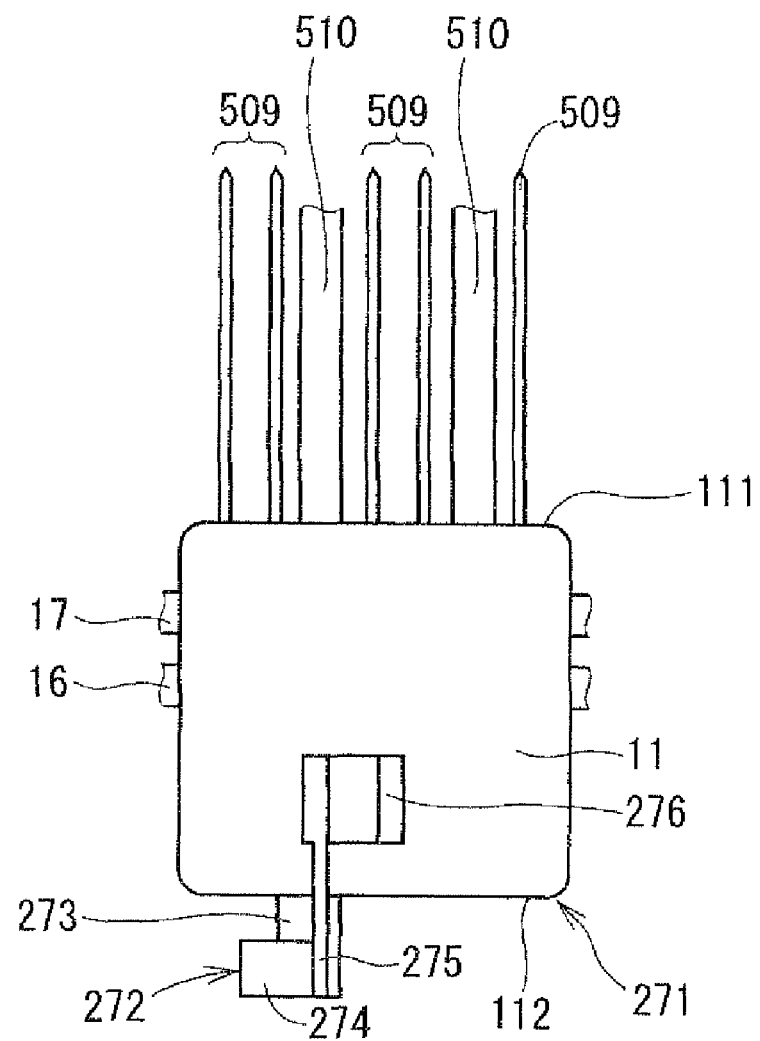
FIG. 25 is a front view showing a semiconductor module used in the seventh embodiment.

As shown in FIG. 25, the connection part 276 is formed thicker than the droop part 273, the intermediate part 274 and the rise part 275. As a result, even in case that the coil 205 is thick relative to the thickness of the coil terminal 272, the coil terminal 274 and the lead wire 206 of the coil 205 can be connected surely.

Eighth Embodiment

Figure 27:
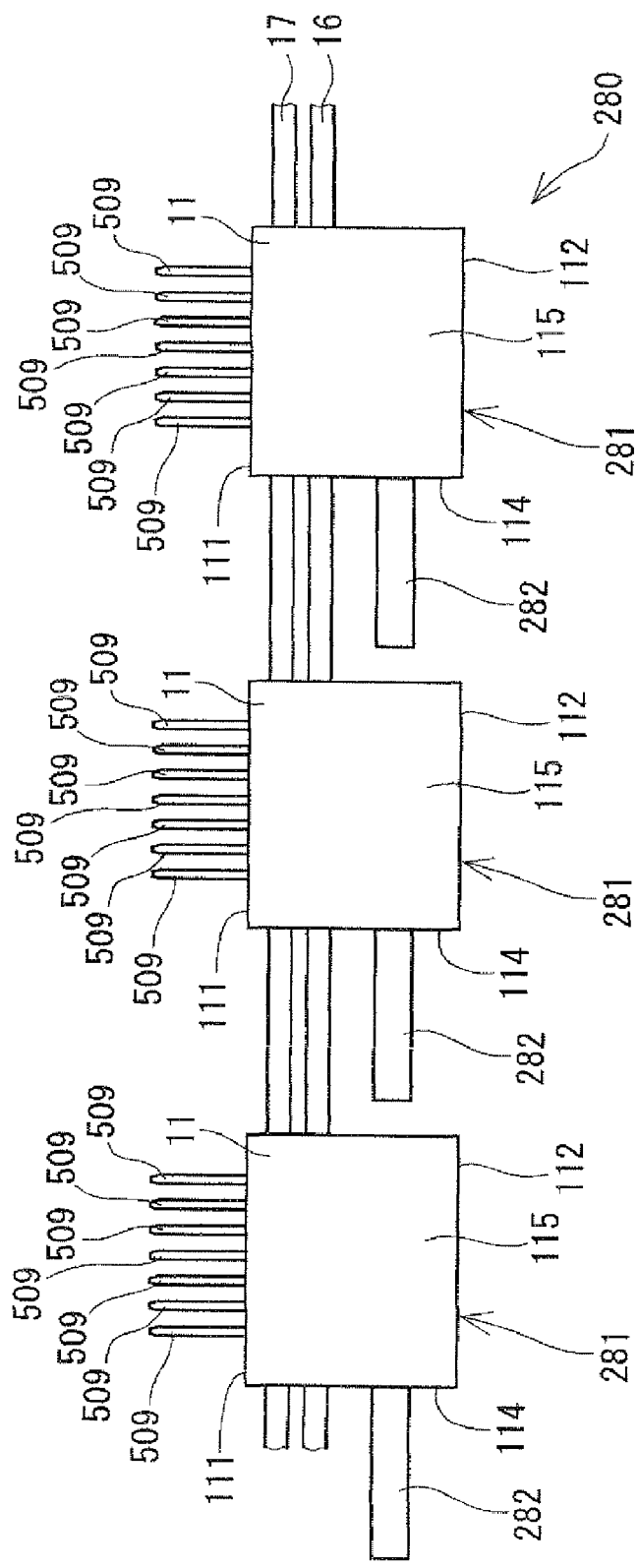
FIG. 27 is a front view showing a state of a coil terminal of a linked semiconductor module unit before being bent to be used in an electronic circuit-integrated motor device according to the eighth embodiment of the present invention.
Figure 28A:
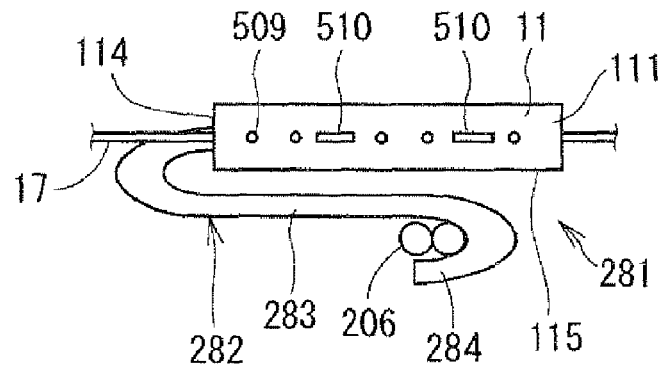
FIG. 28A is a plan view showing connection of the semiconductor module and a coil in the eighth embodiment.
Figure 28B:
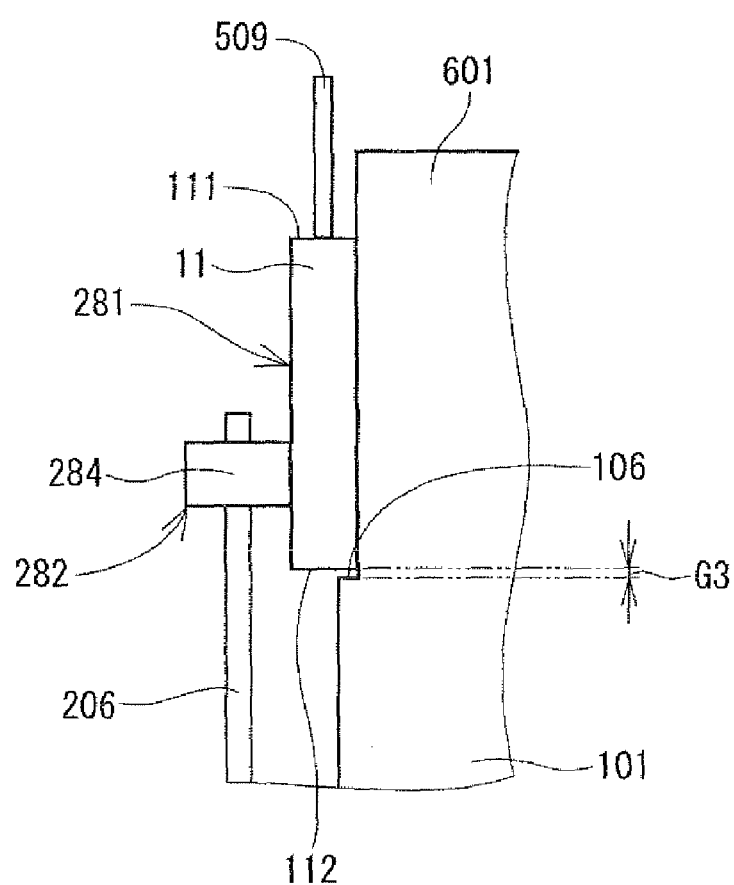
FIG. 28B is a side view showing the semiconductor module used in the eighth embodiment.

In the eighth embodiment, a semiconductor module for an electronic circuit-integrated motor device is configured as shown in FIGS. 27, 28A and 28B. In FIG. 27, the capacitor terminals are not shown.

A coil terminal 282 of a semiconductor module 281 of a linked semiconductor module unit 280 is protruded from a narrow side wall surface 114 of the resin part 11, which is adjacent to and perpendicular to the bottom side wall surface 112 facing the end wall 106 of the motor case 101. The narrow side wall surface 114 faces a similar narrow side wall surface of the adjacent resin unit 11. The coil terminal 282 extends in parallel to the bus bars 16 and 17. The coil terminal 282 is formed in a linear or straight shape before being bent.

The coil terminal 282 has an intermediate part 283 and a connection part 284. The intermediate part 283 is turned back toward the narrow side wall surface 114 side forming an acute angle as shown in FIG. 28A. The connecting part 284 is turned in parallel to a wide side surface area 115 of the resin part 11 to open in a direction, in which the coil terminal 282 protrudes from the narrow side surface wall 114. The connection part 284 clamps the lead wire 206 of the coil 205 and is welded to the lead wire 206. The coil terminal 282 and the lead wire 206 of the coil 205 are thus directly connected. The coil terminal 282 is thus bent in an S-shape as shown in FIG. 28A when viewed in the axial direction of the motor case 101.

In case that the linked semiconductor module unit 280 is arranged within the motor device 1, the connection part 284 of the coil terminal 282 is positioned between the bottom side wall surface 112 of the resin part 11, which faces the end wall 106 of the motor case 101, and the top side wall surface 111 of the resin part 11, which faces the printed circuit board 801 and is opposite to the end wall 106. As a result, the same advantage is provided as in the first embodiment. In the state before the coil terminal 272 is bent, the connection part 284 is provided at the lateral side of the resin part 11, that is, between two resin parts adjacent to each other. The lead frame can be reduced in size.

The coil terminal 282 protrudes from the narrow side wall surface 114, which is perpendicular to the bottom side wall surface 112 facing the end wall 106. Since no leads nor tie bars are exposed from the bottom side wall surface 112 of the resin part 11, no electrical insulation is necessitated between the bottom side wall surface 112 of the semiconductor module 281 and the end wall 106 of the motor case 101. For example, a gap G3 between the bottom side wall surface 112 and the end wall 106 can be shortened as shown in FIG. 28B. In case that no leads nor tie bars are exposed from the bottom side wall surface 112 of the resin part 11, the gap G3 need not be provided between the semiconductor module 281 and the end wall 106 of the motor case 101. That is, the resin part 11 of the semiconductor module 281 may be in contact with the end wall 106 of the motor case 101.

Ninth Embodiment

Figure 29:
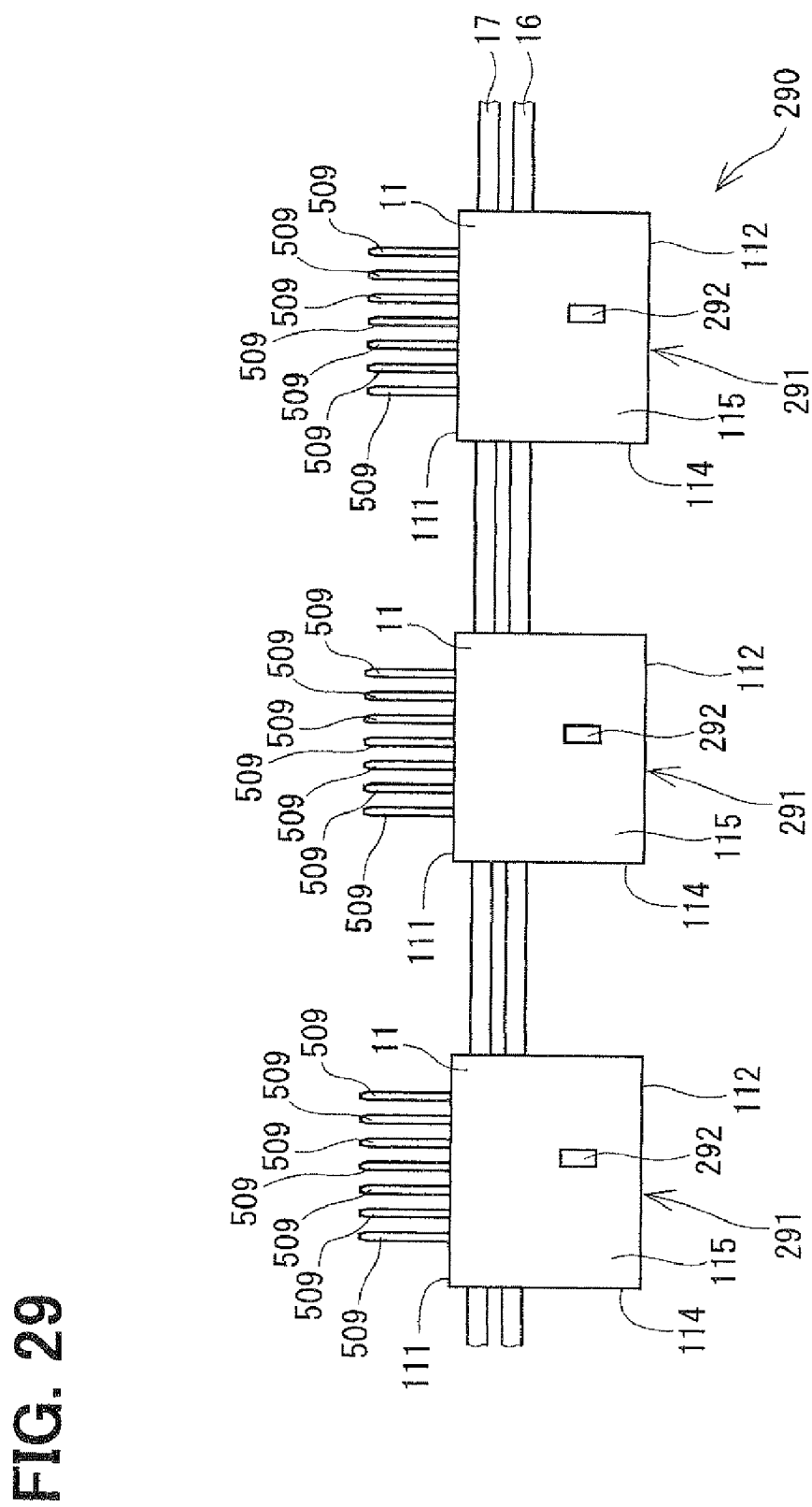
FIG. 29 is a front view showing a coil terminal of a linked semiconductor module unit before being bent to be used in an electronic circuit-integrated motor device according to the ninth embodiment of the present invention.
Figure 30A:
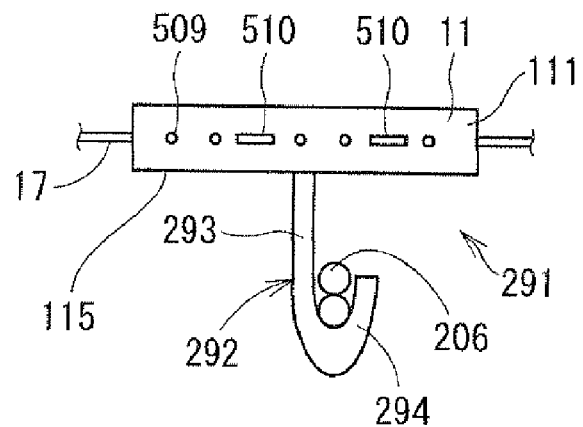
FIG. 30A is a plan view showing connection of the semiconductor module and a coil in the ninth embodiment.
Figure 30B:
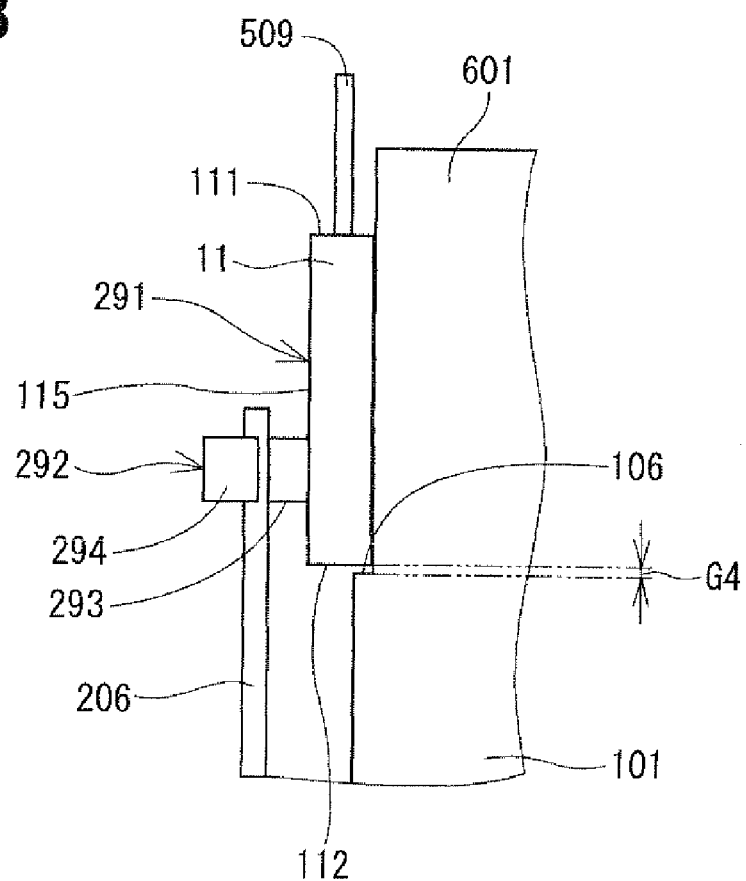
FIG. 30B is a side view showing the semiconductor module used in the ninth embodiment.
Figure 31:
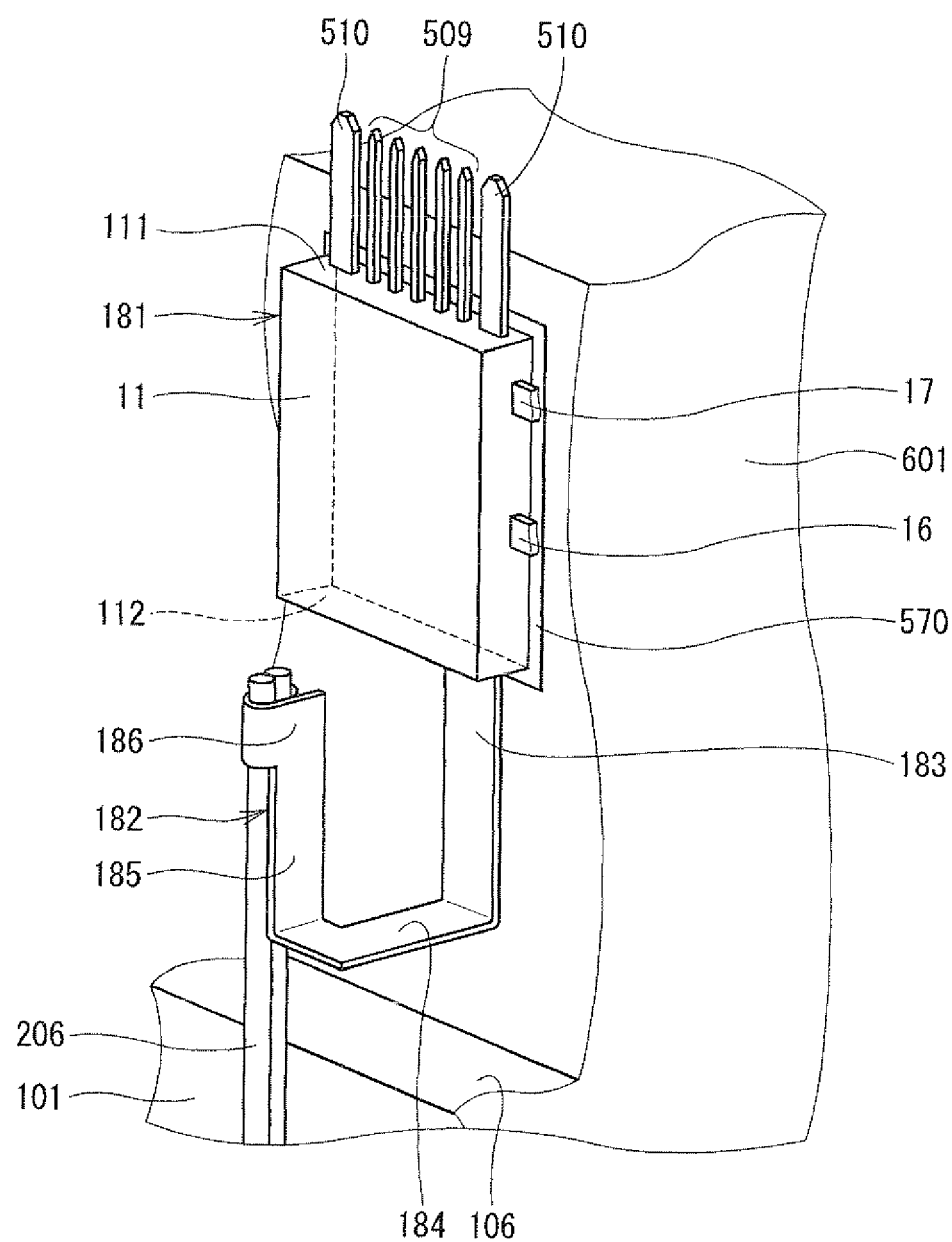
FIG. 31 is a perspective view showing a semiconductor module according to a comparative example.
Figure 32:
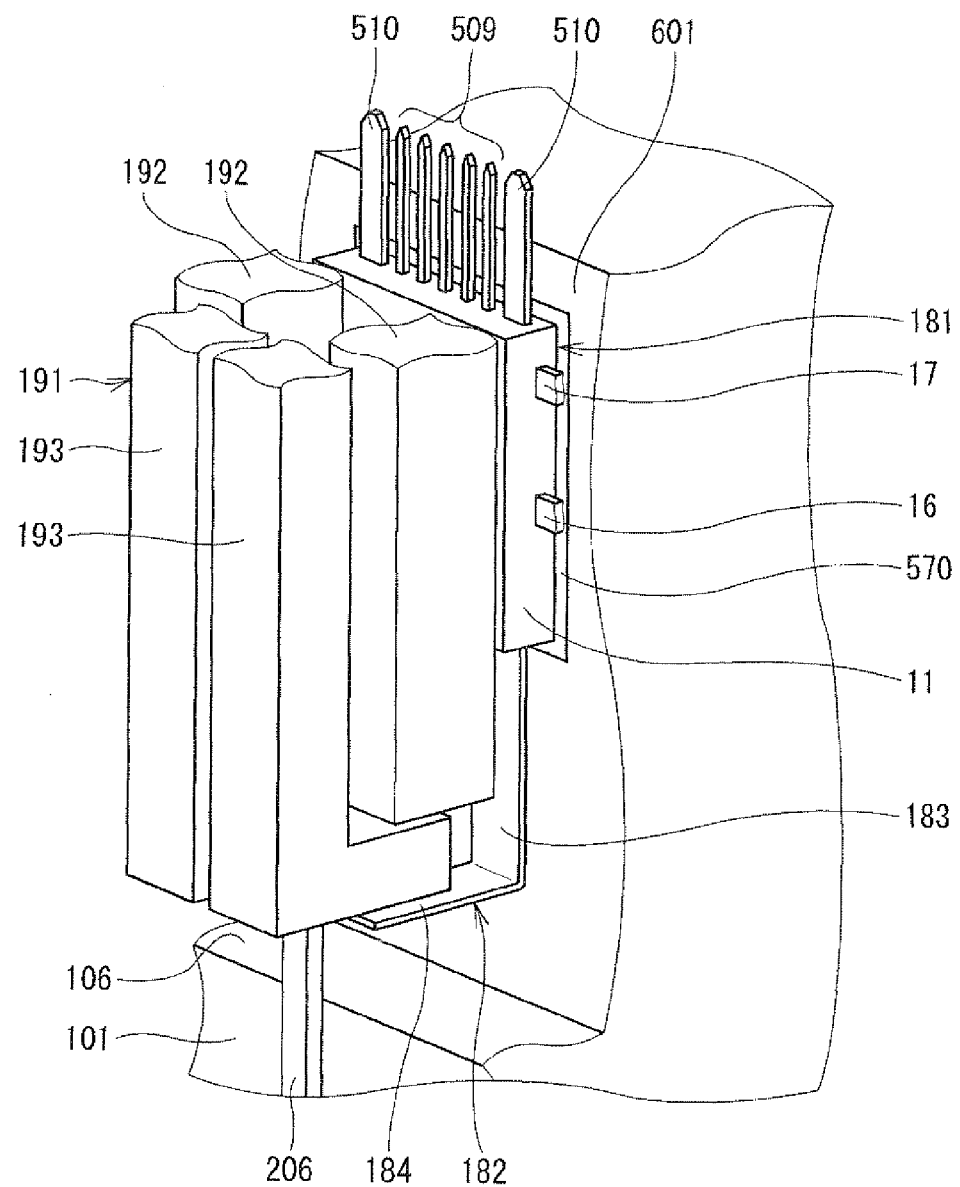
FIG. 32 is a schematic perspective view showing a welding jig and the semiconductor module in the comparative example.
Figure 33:
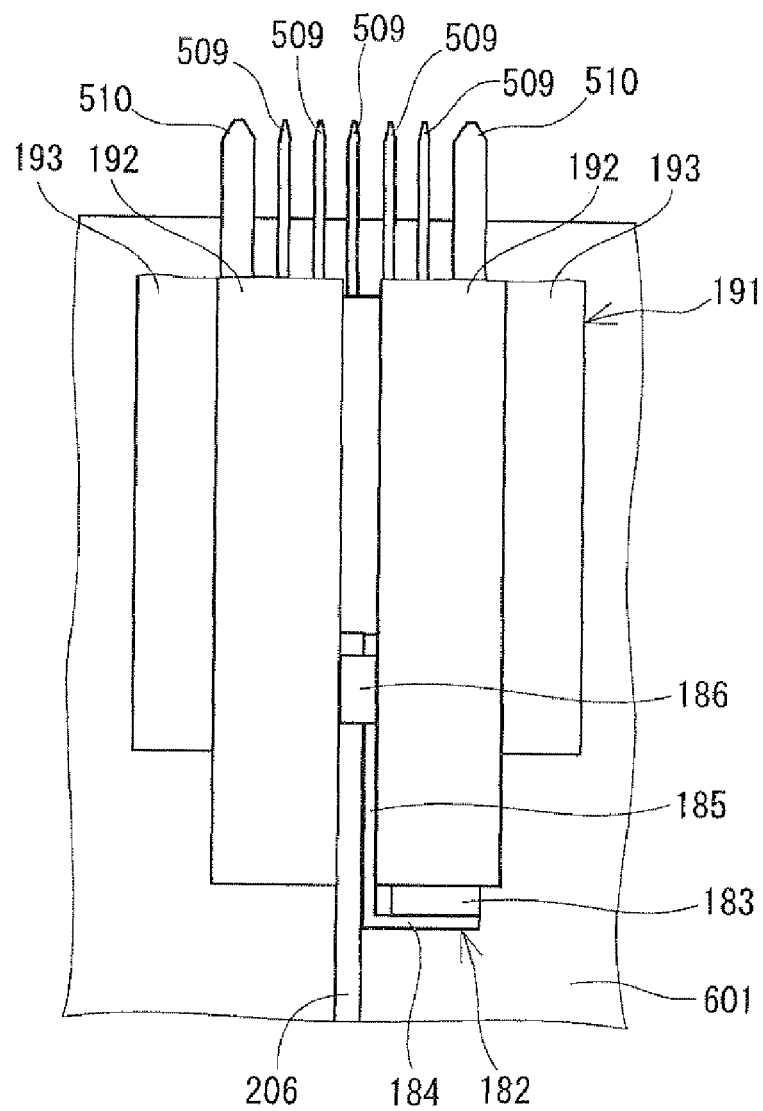
FIG. 33 is a schematic front view showing the welding jig and the semiconductor module in the comparative example.

In the ninth embodiment, a semiconductor module for an electronic circuit-integrated motor device is configured as shown in FIGS. 29, 30A and 30B. In FIG. 29, the capacitor terminals are not shown.

A coil terminal 292 of a semiconductor module 291 of a linked semiconductor module unit 290 is protruded from a wide side wall surface 115 of the resin part 11, which is adjacent to and perpendicular to the bottom side wall surface 112 facing the end wall 106 of the motor case 101. The coil terminal 292 extends perpendicularly to the control terminals 509 and the capacitor terminals 510. It also extends perpendicularly to the bus bars 16 and 17. The coil terminal 292 is formed in a linear or straight shape before being bent.

The coil terminal 292 has an intermediate part 293 and a connection part 294. The connection part 294 is bent to open toward the wide wall surface 115 of the resin part 11. The connection part 294 thus clamps the lead wire 206 of the coil 205 and is welded to the lead wire 206. The coil terminal 292 and the lead wire 206 of the coil 205 are thus directly connected. The coil terminal 292 is thus bent in a J-shape as shown in FIG. 30A when viewed in the axial direction of the motor case 101.

In case that the linked semiconductor module unit 290 is arranged within the motor device 1, the connection part 294 of the coil terminal 292 is positioned between the bottom side wall surface 112 of the resin part 11, which faces the end wall 106 of the motor case 101, and the top side wall surface 111 of the resin part 11, which faces the printed circuit board 801 and is opposite to the end wall 106. As a result, the same advantage is provided as in the first embodiment. The coil terminal 292 protrudes from the wide side wall surface 115, which is adjacent and perpendicular to the bottom side wall surface 112 facing the end wall 106.

In case that no leads nor tie bars are exposed from the bottom side wall surface 112 of the resin part 11, no electrical insulation is necessitated between the bottom side wall surface 112 of the semiconductor module 291 and the end wall 106 of the motor case 101. For example, a gap G4 between the bottom side wall surface 112 and the end wall 106 can be shortened as shown in FIG. 30B. In case that no leads nor tie bars are exposed from the bottom side wall surface 112 of the resin part 11, the gap G4 need not be provided between the semiconductor module 291 and the end wall 106 of the motor case 101. That is, the resin part 11 of the semiconductor module 291 may be in contact with the end wall 106 of the motor case 101. If the resin part 11 is formed after bending the coil terminal 292 in the J-shape, the stress applied to the resin part 11 can be reduced.

Other Embodiment

Although the heat sink 601 is raised from the end wall 106 of the motor case 101 at the radially central part of the end wall 106, it may be raised in a tubular shape from the peripheral part of the end wall 106 and the semiconductor modules may be arranged in planar contact with the radially inside wall surfaces of such a heat sink.

Although a plurality of semiconductor modules are linked by bus bars to form a linked semiconductor module unit, the semiconductor modules need not be linked.

Although each semiconductor module is arranged such that the perpendicular line of the semiconductor chip plane is perpendicular to the radial center of the shaft 401 of the motor 30, it may be arranged such that the perpendicular line may be inclined at various angles.

The present invention is not limited to the disclosed embodiments, but may be implemented in different ways.

What is claimed is:

1. An electronic circuit-integrated motor device comprising:
   a motor case formed in a tubular shape and having an end wall at one axial side thereof;
   a stator arranged radially inside the motor case and wound with coils of a plurality of phases;
   a rotor arranged radially inside the stator;
   a shaft fixed to the rotor to rotate therewith; and
   a semiconductor module including a switching element, a resin part and a coil terminal, the switching element being formed in a semiconductor chip for switching coil currents supplied to the coils, the resin part embedding the semiconductor chip therein and having a top wall surface and a bottom wall surface that faces the top wall surface and the end wall of the motor case in an axial direction of the motor case, and the coil terminal protruding from the resin part and having a connection part directly connected to the coil,
   wherein a distance between the connection part and the end wall of the motor case is greater than a distance between the bottom wall surface of the resin part and the end wall, in the axial direction of the motor case, and
   wherein the coil terminal is protruded from the bottom wall surface of the resin part.

2. The electronic circuit-integrated motor device according to claim 1, wherein:
   a distance between the connection part the end wall of the motor case is less than a distance between the top wall surface of the resin part and the end wall, in the axial direction of the motor case.

3. The electronic circuit-integrated motor device according to claim 1, wherein:
   the coil terminal is bent to clamp the coil thereby providing the connection part.

4. The electronic circuit-integrated motor device according to claim 3, wherein:
   the connection part is located at a position adjacent to a side wall surface of the resin unit, which is between the top wall surface and the bottom wall surface before the coil terminal is bent.

5. The electronic circuit-integrated motor device according to claim 1, wherein:
   the coil terminal includes a droop part, an intermediate part and a rise part, the droop part protruding from the bottom wall surface of the resin part, the intermediate part extending from the droop part in a direction of thickness of the resin part, and the rise part extending from the intermediate part in a direction opposite to the motor case and forming the connection part at a top end thereof.

6. The electronic circuit-integrated motor device according to claim 1, wherein:
the coil terminal includes a cut part having a width that is less than a width of a remainder of the coil terminal.

7. The electronic circuit-integrated motor device according to claim 1, wherein:
the coil terminal is thickened at the connection part.

8. The electronic circuit-integrated motor device according to claim 1, wherein:
the semiconductor module further includes a link member having an embedded part and an exposed part, which are embedded in and exposed from the resin part, respectively, and
the exposed part is contiguous with an embedded part, which is embedded in another semiconductor module.

9. The electronic circuit-integrated motor device according to claim 1, further comprising:
a printed circuit board having a control circuit for controlling current supply to the coils,
wherein the semiconductor module further includes control terminals connected to the control circuit, and
wherein the coil terminal and the control terminals are protruded from different wall surfaces of the resin part.

10. The electronic circuit-integrated motor device according to claim 9, wherein:
the coil terminal and the control terminals are protruded in opposite directions from the resin part, sandwiching the resin part therebetween.

11. The electronic circuit-integrated motor device according to claim 10, wherein:
the semiconductor module is positioned between the motor case and the printed circuit board in the axial direction of the motor case.

12. The electronic circuit-integrated motor device according to claim 1, further comprising:
a heat sink raised from the end wall of the motor case in the axial direction of the motor case,
wherein the semiconductor module is arranged in planar contact with the heat sink.

13. The electronic circuit-integrated motor device according to claim 1, further comprising:
the semiconductor module is arranged such that a line perpendicular to a surface of the semiconductor chip is non-parallel to a central line of the shaft.

* * * * *